United States Patent
Omura et al.

(10) Patent No.: US 6,831,731 B2
(45) Date of Patent: Dec. 14, 2004

(54) PROJECTION OPTICAL SYSTEM AND AN EXPOSURE APPARATUS WITH THE PROJECTION OPTICAL SYSTEM

(75) Inventors: Yasuhiro Omura, Kumagaya (JP); Naomasa Shiraishi, Saitama (JP); Issey Tanaka, Yokohama (JP); Soichi Owa, Kumagaya (JP); Toshihiko Ozawa, Fukaya (JP); Shunsuke Niisaka, Fujisawa (JP)

(73) Assignee: Nikon Corporation, Tokyo (JP)

( * ) Notice: Subject to any disclaimer, the term of this patent is extended or adjusted under 35 U.S.C. 154(b) by 41 days.

(21) Appl. No.: 10/183,612

(22) Filed: Jun. 28, 2002

(65) Prior Publication Data

US 2003/0058421 A1 Mar. 27, 2003

Related U.S. Application Data

(60) Provisional application No. 60/308,867, filed on Aug. 1, 2001.

(30) Foreign Application Priority Data

Jun. 28, 2001 (JP) ........................................ 2001-196123

(51) Int. Cl.$^7$ ........................ G03B 27/54; G03B 27/70; G03B 27/72
(52) U.S. Cl. .............................. 355/67; 355/66; 355/71
(58) Field of Search .............................. 355/53, 66, 67, 355/71

(56) References Cited

U.S. PATENT DOCUMENTS

| | | | |
|---|---|---|---|
| 5,668,672 A | 9/1997 | Oomura | |
| 5,861,997 A | 1/1999 | Takahashi | |
| 6,137,626 A | 10/2000 | Takaoka | |
| 6,201,634 B1 | 3/2001 | Sakuma et al. | |
| 6,366,404 B1 | 4/2002 | Hiraiwa et al. | |
| 6,697,199 B2 | 2/2004 | Gerhard et al. | |
| 2001/0040722 A1 | 11/2001 | Shafer et al. | |
| 2002/0044260 A1 | 4/2002 | Takahashi et al. | |
| 2003/0000453 A1 | 1/2003 | Unno et al. | |
| 2003/0012724 A1 | 1/2003 | Burnett et al. | |
| 2003/0021026 A1 | 1/2003 | Allan et al. | |
| 2003/0099047 A1 | 5/2003 | Hoffman et al. | |
| 2003/0128349 A1 * | 7/2003 | Unno | 355/67 |
| 2004/0105170 A1 | 6/2004 | Krahmer et al. | |

FOREIGN PATENT DOCUMENTS

| | | |
|---|---|---|
| EP | 1 114 802 A1 | 7/2001 |
| JP | A-11-54411 | 2/1999 |
| JP | A-2000-331927 | 11/2000 |
| WO | WO 02/093209 A2 | 11/2002 |
| WO | WO 02/093257 A2 | 11/2002 |
| WO | WO 03/009021 A1 | 1/2003 |
| WO | WO 03/009062 A1 | 1/2003 |

OTHER PUBLICATIONS

English-language translation of Japanese Laid-Open Patent Application 2000-331927.

(List continued on next page.)

Primary Examiner—Rodney Fuller
(74) Attorney, Agent, or Firm—Oliff & Berridge PLC

(57) ABSTRACT

A projection optical system, which forms a reduced image of a first surface onto a second surface, has excellent optical performance without substantially being affected by birefringence despite the use of optical material having intrinsic birefringence. This is done by suitably arranging certain crystal axes of radiation transmissive members that make up the projection optical system relative to the optical axis of the projection optical system, and by suitably arranging the certain crystal axes of the radiation transmissive members relative to the crystal axes of other radiation transmissive members in the projection optical system.

70 Claims, 17 Drawing Sheets

OTHER PUBLICATIONS

Birefringence of CaF2, Kurt Nattermann, International SEMATECH Calcium Fluoride Birefringence Work Shop, Jul. 2001.

Intrinsic birefringence in calcium fluoride and barium fluoride, Physical Review B, vol. 64 241102(R), John H. Burnett et al., Nov. 29, 2002.

Intrinsic Birefringence in 157 nm Materials, John H. Burnett et al., $2^{nd}$ International Symposium on 157 nm Lithography, May 15, 2001.

Application No. 09/769,832 filed Jan. 26, 2001.
Application No. 10/191,550 filed Jul. 10, 2002.
Application No. 10/207,109 filed Jul. 30, 2002.
Application No. 10/191,428 filed Jul. 10, 2002.
Application No. 10/175,101 filed Jun. 20, 2002.
Burnett et al., "Instrinsic Birefringence in 157 nm Materials", $2^{nd}$ International Symposium on 157 nm Lithography on May 15, 2001.
English–language translation of JP–A–11–54411.

* cited by examiner

PROJECTION OPTICAL SYSTEM AND AN EXPOSURE APPARATUS WITH THE PROJECTION OPTICAL SYSTEM

This non-provisional application claims the benefit of U.S. Provisional Application No. 60/308,867 filed Aug. 1, 2001. The disclosure of Japanese Priority Application No. 2001-196123 filed Jun. 28, 2001, is incorporated herein by reference in its entirety.

BACKGROUND OF THE INVENTION

1. Field of Invention

The present invention relates to a projection optical system and an exposure apparatus provided with a projection optical system. In particular, the present invention relates to a suitable catadioptric type projection optical system in an exposure apparatus used when fabricating microdevices such as semiconductors or the like in a photolithographic process.

2. Description of Related Art

In recent years, the miniaturization in semiconductor device fabrication and. semiconductor chip packaging fabrication is increasing, and a projection optical system with a higher resolution is required for a photolithographic exposure device. To satisfy this resolution requirement, the wavelength of the exposure light is shortened, and the NA (the numerical aperture of a projection optical system) is increased. However, when the wavelength of the exposure light is shortened, the types of optical glass that are able to be used are limited due to light absorption.

For example, when using light in a vacuum ultraviolet region with a wavelength of 200 nm or less, an $F_2$ laser (wavelength 157 nm) in particular, as the exposure light, a fluoride crystal such as calcium fluoride (fluorite: $CaF_2$) and barium fluoride ($BaF_2$) must be used as a radiation transmissive optical material in the projection optical system. In reality, a design that forms a projection optical system with only fluorite is assumed in an exposure apparatus using an $F_2$ laser. Fluorite is a cubic system that was thought to be optically isotropic and to have substantially no birefringence. Further, in prior visible light experiments, only low birefringence (random occurrences caused by internal stress) has been observed in fluorite.

However, at a symposium (2nd International Symposium on 157 nm Lithography) concerning lithography held on May 15, 2001, John H. Burnett et al. of the U.S. NIST announced that he confirmed both in theory and by experiment that fluorite has an intrinsic birefringence.

According to this presentation, fluorite birefringence is nearly zero in the crystal axis direction [111] and the equivalent axes [−111], [1−11] and [11−1], and in the crystal axis [100] and equivalent axes [010] and [001], but other directions have a value which is not substantially zero. In particular, the six crystal axis directions [110], [−110], [101], [−101], [001] and [01−1] have a maximum birefringence of 6.5 nm/cm for a wavelength of 157 nm and 3.6 nm/cm for a wavelength of 193 nm. These values of birefringence are substantially greater than 1 nm/cm, the permissible value of random birefringence. However, for the portion that is not random the effect of birefringence may accumulate through multiple lenses.

Previously, the birefringence of fluorite was not considered in designing a projection optical system, so from the perspective of working ease, the crystal axis [111] and the optical axis are generally aligned. In such a case, in a projection optical system, the NA (numerical aperture) is comparatively large, so the crystal performance may deteriorate due to the effect of birefringence because the light ray that is somewhat tilted from the crystal axis [111] also passes through the lens.

However, Burnett et al. revealed in the presentation mentioned above, a method of compensating for the effect of birefringence by aligning the optical axis of a pair of fluorite lenses with the crystal axis [111] and rotating a pair of fluorite crystals 60° relatively with the optical axis at the center. It is possible to alleviate the effect of birefringence with this method, but the effect of the compensation is not sufficient because the effect of birefringence is not actively compensated for due to the effect of birefringence in the opposite direction.

Also, when using $F_2$ laser light (157 nm wavelength) as an exposure light, the outgas from the photoresist caused by exposure is unavoidable. Therefore, unless extraordinary steps are taken, it is impossible to avoid a contamination of the lenses caused by outgas in a conventional projection optical system having a large numerical aperture.

SUMMARY OF THE INVENTION

The present invention addresses the above-described problems. One object of the present invention is to provide a projection optical system having excellent optical performance that is substantially not affected by birefringence even when using optical materials with intrinsic birefringence such as fluorite, for example, and to provide an exposure apparatus having the projection optical system. A further object of the present invention is to provide a projection optical system capable of effectively avoiding contamination of the lenses caused by outgas from the photoresist, and to provide an exposure apparatus as part of the projection optical system.

In order to address the above-described problems, a first aspect of the present invention provides a projection optical system capable of forming a reduced image of a first surface onto a second surface, and includes a plurality of lenses and at least one concave reflective mirror, wherein the projection optical system, when used in an exposure apparatus to scan expose the first surface onto the second surface while moving the first surface and the second surface along a scanning direction, forms a slit-shaped or arc-shaped exposure area at the second surface when not scanning; and satisfies the conditional expression $$0.5 < (Dw \cdot Nw)/Ew < 1.4 \qquad (1)$$

where Dn is a working distance of the second surface side, Nw is a numerical aperture of the second surface side, and Ew is a length in the direction orthogonal to the scanning direction in the slit-shaped or arc-shaped exposure area. It should be noted that a slit shape in the present invention refers to a shape extending in a direction across a scanning direction, for example, a rectangular, trapezoidal or hexagonal shape extending in a direction across a scanning direction.

According to a preferred embodiment of the first aspect of the invention, a projection optical system has a slit-shaped or arc-shaped exposure area that does not intersect the optical axis of the projection optical system. The projection optical system is provided with a refractive type first optical imaging system to form a first intermediate image of a first surface; a second optical imaging system, having at least one negative lens and a concave reflective mirror, to form the first intermediate image into a second intermediate image of nearly the same magnification near the first intermediate image forming position based on the light beam from the first intermediate image; a refractive type third optical imaging system to form a reduced image of the second intermediate image onto a second surface based on the light beam from the second intermediate image; a first optical path folding mirror arranged in the optical path between the first optical imaging system and the second optical imaging system; and a second optical path folding mirror arranged in the optical path between the second optical imaging system and the third optical imaging system. In this case, the effective area of the first optical path folding mirror and the effective area of the second optical path folding mirror preferably have a reflective surface formed across the whole of the planar surface. It is preferable that the effective area of the first optical path folding mirror and the effective area of the second optical path folding mirror not have a spatial overlap, and be arranged such that the whole light beam from the first surface is guided to the second surface.

Further, according to a preferred embodiment of the first aspect of the invention, all lenses comprising the first optical imaging system and the third optical imaging system are arranged along a single straight line along the optical axis. Furthermore, in the first aspect of the present invention, the projection optical system is preferably provided with a catadioptric type imaging system including a concave reflective mirror arranged in the optical path, between the first surface and the second surface; a refractive type imaging system arranged in the optical path between the catadioptric type optical imaging system and the second surface; a first optical path folding mirror arranged in the optical path between the first surface and the catadioptric type optical imaging system; and a second optical path folding mirror placed in the optical path arranged in the optical path between the catadioptric type optical imaging system and the refractive type optical imaging system.

A second aspect of the present invention provides a projection optical system including a plurality of lenses, a concave reflective mirror and a negative lens arranged in proximity to the concave reflective mirror, and is capable of forming a reduced image of a first surface at a second surface. The projection optical system, when used in an exposure apparatus to scan expose the first surface at the second surface while moving the first surface and the second surface along a scanning direction, forms a slit-shaped or arc-shaped exposure area at the second surface when not scanning; and the numerical aperture of the second surface side is 0.82 or more.

In one example, the concave reflective mirror and the negative lens are arranged along an optical axis in a direction substantially different from the direction of gravity, and the following conditional expression is satisfied:

$$1.0 < S/|R| < 1.8 \tag{2}$$

wherein S is the clear aperture (diameter) of the concave reflective mirror and R is the radius of curvature of the concave reflective mirror. Further, in the second aspect of the present invention, the projection optical system is preferably provided with a catadioptric type imaging system including a concave reflective mirror arranged in the optical path between the first surface and the second surface; a refractive type imaging system arranged in the optical path between the catadioptric type optical imaging system and the second surface; a first optical path folding mirror arranged in the optical path between the first surface and the catadioptric type optical imaging system; and a second optical path folding mirror placed in the optical path arranged in the optical path between the catadioptric type optical imaging system and the refractive type optical imaging system.

A third aspect of the present invention provides a projection optical system capable of forming a reduced image of a first surface at a second surface, wherein the projection optical system is arranged in an optical path between a pupil position of the second surface side and the second surface, has a substantially transmissive characteristic for light with a wavelength of 200 nm or less, and is provided with at least one radiation transmissive member formed such that a crystal axis [100] or an optically equivalent crystal axis to the crystal axis [100] nearly aligns with the optical axis.

A fourth aspect of the present invention provides a projection optical system capable of forming a reduced image of a first surface at a second surface, wherein at least one radiation transmissive member of the radiation transmissive members exceeding a maximum angle of the transmitting light ray of 20 degrees to the optical axis has substantially transmissive characteristics for light with a wavelength of 200 nm or less, and is formed such that a crystal axis [100] or an optically equivalent crystal axis to the crystal axis [100] nearly aligns with the optical axis.

A fifth aspect of the present invention provides a projection optical system capable of forming a reduced image of a first surface at a second surface, wherein the projection optical system is provided with: a first group of transmissive members formed such that the crystal axis [100] or an optically equivalent crystal axis to the crystal axis [100] nearly aligns with the optical axis, and has substantially transmissive characteristics for light with a wavelength of 200 nm or less; a second group of transmissive members formed such that the crystal axis [100] or an optically equivalent crystal axis to the crystal axis [100] nearly aligns with the optical axis, and has substantially transmissive characteristics for light with a wavelength of 200 nm or less; wherein the first group of transmissive members and the second group of transmissive members have a positional relationship relatively rotated about 45 degrees around the optical axis; and both the first group of transmissive members and the second group of transmissive members are arranged in the optical path between the pupil position on the second surface side and the second surface.

A sixth aspect of the present invention provides a projection optical system capable of forming a reduced image of a first surface at a second surface, wherein the projection optical system is provided with: a first group of radiation transmissive members formed such that the crystal axis [100] or an optically equivalent crystal axis to the crystal axis [100] nearly aligns with the optical axis, and has substantially transmissive characteristics for light with a wavelength of 200 nm or less; a second group of radiation transmissive members formed such that the crystal axis [100] or an optically equivalent crystal axis to the crystal axis [100] nearly aligns with the optical axis, and has substantially transmissive characteristics for light with a wavelength of 200 nm or less; wherein the first group of radiation transmissive members and the second group of radiation transmissive members have a positional relationship relatively rotated about 45 degrees around the optical axis; and in both the first group of radiation transmissive members and the second group of radiation transmissive members, the maximum angle of the transmitting light ray to the optical axis is greater than 20 degrees.

It should be noted that in the fifth and sixth aspects of the present invention, to relatively rotate the first group of lens elements and the second group of lens elements about 45 degrees around the optical axis means that the relative angle of the predetermined crystal axes (for example, crystal axes [010], [001], [01–1], or [011]) which are facing in different directions from the optical axis in the first group of lens elements and the second group of lens elements is about 45 degrees around the optical axis. Furthermore, when the crystal axis [100] serves as the optical axis, rotational asymmetry stemming from the effect of birefringence with the optical axis at the center appears at a 90 degree period, so in the fifth and sixth aspects of the invention, to relatively rotate only about 45 degrees around the optical axis means the same as relatively rotating only about 45 degrees+(n*90 degrees) around the optical axis (where n is a whole number).

According to preferred embodiments of the fifth and sixth aspects of the invention, at least one of the first group of radiation transmissive members and the second group of radiation transmissive members has at least one aspherical surface. Further, it is preferable that the conditional expression |T1−T2|/TA<0.025 is satisfied, wherein T1 is the total thickness (center thickness) of the first group of radiation transmissive members along the optical axis, T2 is the total thickness of the second group of radiation transmissive members along the optical axis, and TA is the total thickness along the optical axis of all the radiation transmissive members comprising the projection optical system. Furthermore, the first group of radiation transmissive members and the second group of radiation transmissive members are preferably formed as one optical member by optical contact or by adhesion.

A seventh aspect of the present invention provides a projection optical system which includes a plurality of lenses, a concave reflective mirror and a negative lens arranged in proximity to the concave reflective mirror, and which is capable of forming a reduced image of a first surface at a second surface, wherein the negative lens has substantially transmissive characteristics for light with a wavelength of 200 nm or less, and is formed such that the crystal axis [100] or an optically equivalent crystal axis to the crystal axis [100] nearly aligns with the optical axis.

An eighth aspect of the present invention provides a projection optical system including a plurality of lenses, a concave reflective mirror, and a first negative lens and a second negative lens arranged in proximity to the concave reflective mirror, and capable of forming a reduced image of a first surface at a second surface, wherein: a) the first negative lens is formed such that the crystal axis [100] or an optically equivalent crystal axis to the crystal axis [100] nearly aligns with the optical axis, and has substantially transmissive characteristics for light with a wavelength of 200 nm or less; b) the second negative lens is formed such that the crystal axis [100] or an optically equivalent crystal axis to the crystal axis [100] nearly aligns with the optical axis, and has substantially transmissive characteristics for light with a wavelength of 200 nm or less; and c) the first negative lens and second negative lens have a positional relationship relatively rotated only about 45 degrees around the optical axis.

It should be noted that in the eighth aspect of the present invention, to relatively rotate a first negative lens and a second negative lens about 45 degrees around the optical axis means that the relative angle of the predetermined crystal axes (for example, crystal axes [010], [001], [01–1], or [011]) which are facing in different directions from the optical axis in a first negative lens and a second negative lens is about 45 degrees around the optical axis. Furthermore, when the crystal axis [100] serves as the optical axis, rotational asymmetry stemming from the effect of birefringence with the optical axis at the center appears at a 90 degree period, so in the eighth aspect of the invention, to relatively rotate only about 45 degrees around the optical axis means the same as relatively rotating only about 45 degrees+(n*90 degrees) around the optical axis (where n is a whole number).

A ninth aspect of the present invention provides a projection optical system capable of forming a reduced image of a first surface at a second surface, wherein the projection optical system is arranged in the optical path between the pupil position of the second surface side and the second surface, has a substantially transmissive characteristic for light with a wavelength of 200 nm or less, and is provided with at least one radiation transmissive member formed such that the crystal axis [110] or an optically equivalent crystal axis to the crystal axis [110] nearly aligns with the optical axis.

A tenth aspect of the present invention provides a projection optical system capable of forming a reduced image of a first surface at a second surface, wherein at least one radiation transmissive member of the radiation transmissive members exceeding a maximum angle of the transmitting light ray of 20 degrees to the optical axis has substantially transmissive characteristics for light with a wavelength of 200 nm or less, and is formed such that the crystal axis [110] or an optically equivalent crystal axis to the crystal axis [110] nearly aligns with the optical axis.

An eleventh aspect of the present invention provides a projection optical system capable of forming a reduced image of a first surface at a second surface, wherein the projection optical system is provided with: a third group of transmissive members formed such that the crystal axis [100] or an optically equivalent crystal axis to the crystal axis [100] nearly aligns with the optical axis, and has substantially transmissive characteristics for light with a wavelength of 200 nm or less; a fourth group of transmissive members formed such that the crystal axis [100] or an optically equivalent crystal axis to the crystal axis [100] nearly aligns with the optical axis, and has substantially transmissive characteristics for light with a wavelength of 200 nm or less; wherein the third group of transmissive members and the fourth group of transmissive members have a positional relationship relatively rotated about 90 degrees around the optical axis; and both the third group of transmissive members and the fourth group of transmissive members are arranged in the optical path between the pupil position on the second surface side and the second surface.

A twelfth aspect of the present invention provides a projection optical system capable of forming a reduced image of a first surface at a second surface, wherein the projection optical system is provided with: a third group of radiation transmissive members formed such that the crystal axis [110] or an optically equivalent crystal axis to the crystal axis [110] nearly aligns with the optical axis, and has substantially transmissive characteristics for light with a wavelength of 200 nm or less; a fourth group of radiation transmissive members formed such that the crystal axis [110] or an optically equivalent crystal axis to the crystal axis [110] nearly aligns with the optical axis, and has substantially transmissive characteristics for light with a wavelength of 200 nm or less; wherein the third group of radiation transmissive members and the fourth group of radiation transmissive members have a positional relationship relatively rotated about 90 degrees around the optical axis; and in both the third group of radiation transmissive members and the fourth group of radiation transmissive members, the maximum angle of the transmitting light ray to the optical axis is greater than 20 degrees.

It should be noted that in the eleventh and twelfth aspects of the present invention, to relatively rotate the first group of lens elements and the second group of lens elements about 90 degrees around the optical axis means that the relative angle of the predetermined crystal axes (for example, crystal axes [001], [−111], [−110], or [1−11]) which are facing in different directions from the optical axis in the first group of lens elements and the second group of lens elements is about 90 degrees around the optical axis. Furthermore, when the crystal axis [110] serves as the optical axis, rotational asymmetry stemming from the effect of birefringence with the optical axis at the center appears at a 180 degree period, so in the eleventh and twelfth aspects of the invention, to relatively rotate only about 90 degrees around the optical axis means the same as relatively rotating only about 90 degrees+(n*180 degrees) around the optical axis (where n is a whole number).

According to preferred embodiments in the eleventh and twelfth aspects of the invention, at least one of the third group of radiation transmissive members and the fourth group of radiation transmissive members has at least one aspherical surface. Further, it is preferable that the conditional expression |T3−T4|/TA<0.025 is satisfied, wherein T3 is the total thickness (center thickness) of the third group of radiation transmissive members along the optical axis, T4 is the total thickness of the fourth group of radiation transmissive members along the optical axis, and TA is the total thickness along the optical axis of all the radiation transmissive members comprising the projection optical system. Furthermore, the third group of radiation transmissive members and the fourth group of radiation transmissive members are preferably formed as one optical member by optical contact or by adhesion.

A thirteenth aspect of the present invention provides a projection optical system which includes a plurality of lenses, a concave reflective mirror and a negative lens arranged in proximity to the concave reflective mirror, and which is capable of forming a reduced image of a first surface at a second surface, wherein the negative lens has substantially transmissive characteristics for light with a wavelength of 200 nm or less, and is formed such that the crystal axis [110] or an optically equivalent crystal axis to the crystal axis [110] nearly aligns with the optical axis.

A fourteenth aspect of the present invention provides a projection optical system including a plurality of lenses, a concave reflective mirror, and a first negative lens and a second negative lens arranged in proximity to the concave reflective mirror, and capable of forming a reduced image of a first surface at a second surface, wherein: the first negative lens is formed such that the crystal axis [110] or an optically equivalent crystal axis to the crystal axis [110] nearly aligns with the optical axis, and has substantially transmissive characteristics for light with a wavelength of 200 nm or less; the second negative lens is formed such that the crystal axis [110] or an optically equivalent crystal axis to the crystal axis [110] nearly aligns with the optical axis, and has substantially transmissive characteristics for light with a wavelength of 200 nm or less; and the first negative lens and second negative lens have a positional relationship relatively rotated about 90 degrees around the optical axis.

It should be noted that in the fourteenth aspect of the present invention, to relatively rotate the first negative lens and the second negative lens about 90 degrees around the optical axis means that the relative angle of the predetermined crystal axes (for example, crystal axes [001], [−111], [−110], or [1−11]) which are facing in different directions from the optical axis in the first group of lens elements and the second group of lens elements is about 90 degrees around the optical axis. Furthermore, when the crystal axis [110] serves as the optical axis, rotational asymmetry stemming from the effect of birefringence with the optical axis at the center appears at a 180 degree period, so in the fourteenth aspect of the invention, to relatively rotate only about 90 degrees around the optical axis means the same as relatively rotating only about 90 degrees+(n*180 degrees) around the optical axis (where n is a whole number).

A fifteenth aspect of the present invention provides a projection optical system capable of forming a reduced image of a first surface at a second surface, wherein the projection optical system is provided with: a fifth group of radiation transmissive members formed such that the crystal axis [111] or an optically equivalent crystal axis to the crystal axis [111] nearly aligns with the optical axis, and has substantially transmissive characteristics for light with a wavelength of 200 nm or less; a sixth group of radiation transmissive members formed such that the crystal axis [111] or an optically equivalent crystal axis to the crystal axis [111] nearly aligns with the optical axis, and has substantially transmissive characteristics for light with a wavelength of 200 nm or less; wherein the fifth group of radiation transmissive members and the sixth group of radiation transmissive members have a positional relationship relatively rotated about 60 degrees around the optical axis; and both the fifth group of radiation transmissive members and the sixth group of radiation transmissive members are arranged in the optical path between the pupil position on the second surface side and the second surface.

A sixteenth aspect of the present invention provides a projection optical system capable of forming a reduced image of a first surface at a second surface, wherein the projection optical system is provided with: a fifth group of radiation transmissive members formed such that the crystal axis [111] or an optically equivalent crystal axis to the crystal axis [111] nearly aligns with the optical axis, and has substantially transmissive characteristics for light with a wavelength of 200 nm or less; a sixth group of radiation transmissive members formed such that the crystal axis [111] or an optically equivalent crystal axis to the crystal axis [111] nearly aligns with the optical axis, and has substantially transmissive characteristics for light with a wavelength of 200 nm or less; wherein the fifth group of radiation transmissive members and the sixth group of radiation transmissive members have a positional relationship relatively rotated about 60 degrees around the optical axis; and in both the fifth group of radiation transmissive members and the sixth group of radiation transmissive members, the maximum angle of the transmitting light ray to the optical axis is greater than 20 degrees.

It should be noted that in the eleventh and twelfth aspects of the present invention, to relatively rotate the fifth group of radiation transmissive members and the sixth group of radiation transmissive members about 60 degrees around the optical axis means that the relative angle of the predetermined crystal axes (for example, crystal axes [−111], [11−1], or [1−11]) which are facing in different directions from the optical axis in the fifth group of radiation transmissive members and the sixth group of radiation transmissive members is about 60 degrees around the optical axis. Furthermore, when the crystal axis [111] serves as the optical axis, rotational asymmetry stemming from the effect of birefringence with the optical axis at the center appears at a 120 degree period, so in the eleventh and twelfth aspects of the invention, to relatively rotate only about 60 degrees around the optical axis means the same as relatively rotating only about 60 degrees+(n*120 degrees) around the optical axis (where n is a whole number).

According to preferred embodiments of the fifteenth and sixteenth aspects of the invention, at least one of the fifth group of radiation transmissive members and the sixth group of radiation transmissive members has at least one aspherical surface. Further, it is preferable that the conditional expression |T5−T6|/TA<0.025 is satisfied, wherein T5 is the total thickness (center thickness) of the fifth group of radiation transmissive members along the optical axis, T6 is the total thickness of the sixth group of radiation transmissive members along the optical axis, and TA is the total thickness along the optical axis of all the radiation transmissive members comprising the projection optical system. Furthermore, the fifth group of radiation transmissive members and the sixth group of radiation transmissive members are preferably formed as one optical member by optical contact or by adhesion.

A seventeenth aspect of the present invention provides a projection optical system including a plurality of lenses, a concave reflective mirror, and a first negative lens and a second negative lens arranged in proximity to the concave reflective mirror, and capable of forming a reduced image of a first surface at a second surface, wherein: the first negative lens is formed such that the crystal axis [111] or an optically equivalent crystal axis to the crystal axis [111] nearly aligns with the optical axis, and has substantially transmissive characteristics for light with a wavelength of 200 nm or less; the second negative lens is formed such that the crystal axis [111] or an optically equivalent crystal axis to the crystal axis [111] nearly aligns with the optical axis, and has substantially transmissive characteristics for light with a wavelength of 200 nm or less; and the first negative lens and second negative lens have a positional relationship relatively rotated about 60 degrees around the optical axis.

It should be noted that in the seventeenth aspect of the present invention, to relatively rotate the first negative lens and the second negative lens about 60 degrees around the optical axis means that the relative angle of the predetermined crystal axes (for example, crystal axes [−111], [11−1], or [1−11]) which are facing in different directions from the optical axis in the first group of lens elements and the second group of lens elements is about 60 degrees around the optical axis. Furthermore, when the crystal axis [111] serves as the optical axis, rotational asymmetry stemming from the effect of birefringence with the optical axis at the center appears at a 120 degree period, so in the seventeenth aspect of the invention, to relatively rotate only about 60 degrees around the optical axis means the same as relatively rotating only about 60 degrees+(n*120 degrees) around the optical axis (where n is a whole number).

An eighteenth aspect of the present invention provides a projection optical system capable of forming a reduced image of a first surface at a second surface, wherein the projection optical system: is provided with a radiation transmissive member formed of a crystal having substantially transmissive characteristics for light with a wavelength of 200 nm or less; and a crystal coat formed on the crystal is formed on the surface of the radiation transmissive member; and the crystal direction of the radiation transmissive member and the crystal direction of the crystal coat are different.

According to a preferred embodiment of the eighteenth aspect of the invention, the crystal direction along the optical axis of the radiation transmissive member and the crystal direction along the optical axis of the crystal coat are different. Alternatively, the crystal direction along the optical axis of the radiation transmissive member and the crystal direction along the optical axis of the crystal coat nearly the same, and the radiation transmissive member and the crystal coat preferably have a positional relationship relatively rotated a predetermined angle around the optical axis.

Here, a radiation transmissive member and a crystal coat having a positional relationship relatively rotated a predetermined angle around the optical axis means that the relative angle around the optical axis of specified crystal axes facing different directions from the optical axis in a radiation transmissive member and a crystal coat is a predetermined angle.

A nineteenth aspect of the present invention provides a projection optical system capable of forming a reduced image of a first surface at a second surface, wherein the projection optical system is provided with: a first group of radiation transmissive members formed such that the crystal axis [100] or an optically equivalent crystal axis to the crystal axis [100] nearly aligns with the optical axis, and has substantially transmissive characteristics for light with a wavelength of 200 nm or less; a third group of radiation transmissive members formed such that the crystal axis [110] or an optically equivalent crystal axis to the crystal axis [110] nearly aligns with the optical axis, and has substantially transmissive characteristics for light with a wavelength of 200 nm or less; and a fifth group of radiation transmissive members formed such that the crystal axis [111] or an optically equivalent crystal axis to the crystal axis [111] nearly aligns with the optical axis, and has substantially transmissive characteristics for light with a wavelength of 200 nm or less.

According to preferred embodiments of the invention, the projection optical system is used in an exposure apparatus that moves the first surface and the second surface along a scan direction to scan expose an image of the first surface onto the second surface, and a slit-shaped or arc-shaped exposure area does not intersect the optical axis of the projection optical system. The projection optical system preferably is provided with: a refractive type first optical imaging system to form a first intermediate image of the first surface; a second optical imaging system, having at least one negative lens and a concave reflective mirror, to form the first intermediate image into a second intermediate image of nearly the same magnification near the first intermediate image forming position, based on the light beam from the first intermediate image; a refractive type third optical imaging system to form a reduced image of the second intermediate image onto the second surface based on the light beam from the second intermediate image; a first optical path folding mirror arranged in the optical path between the first optical imaging system and the second optical imaging system; and a second optical path folding mirror arranged in the optical path between the second optical imaging system and the third optical imaging system.

It should be noted that in the above-described embodiments, the effective area of the first optical path folding mirror and the effective area of the second optical path folding mirror preferably have a reflective surface formed across the whole of the planar surface. It is preferable that the effective area of the first optical path folding mirror and the effective area of the second optical path folding mirror do not have a spatial overlap, and they are arranged such that the whole light beam from the first surface is guided to the second surface. Further, according to the above-described embodiments, all lenses comprising the first optical imaging system and the third optical imaging system are arranged along a single straight line of the optical axis. Furthermore, the projection optical system is preferably provided with a catadioptric type imaging system including a concave reflective mirror arranged in the optical path between the first surface and the second surface; a refractive type imaging system arranged in the optical path between the catadioptric type optical imaging system and the second surface; a first optical path folding mirror arranged in the optical path between the first surface and the catadioptric type optical imaging system; and a second optical path folding mirror placed in the optical path arranged in the optical path between the catadioptric type optical imaging system and the refractive type optical imaging system.

Another aspect of the present invention provides an exposure apparatus provided with: an illumination system to illuminate a mask serving as the first surface, and a projection optical system according to any of the above aspects to form a pattern image formed on the mask at a photosensitive substrate serving as the second surface.

Another aspect of the present invention provides an exposure method to illuminate a mask formed with a pattern, and to form an image of a pattern of the mask onto a photosensitive substrate via a projection optical system according to the invention.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
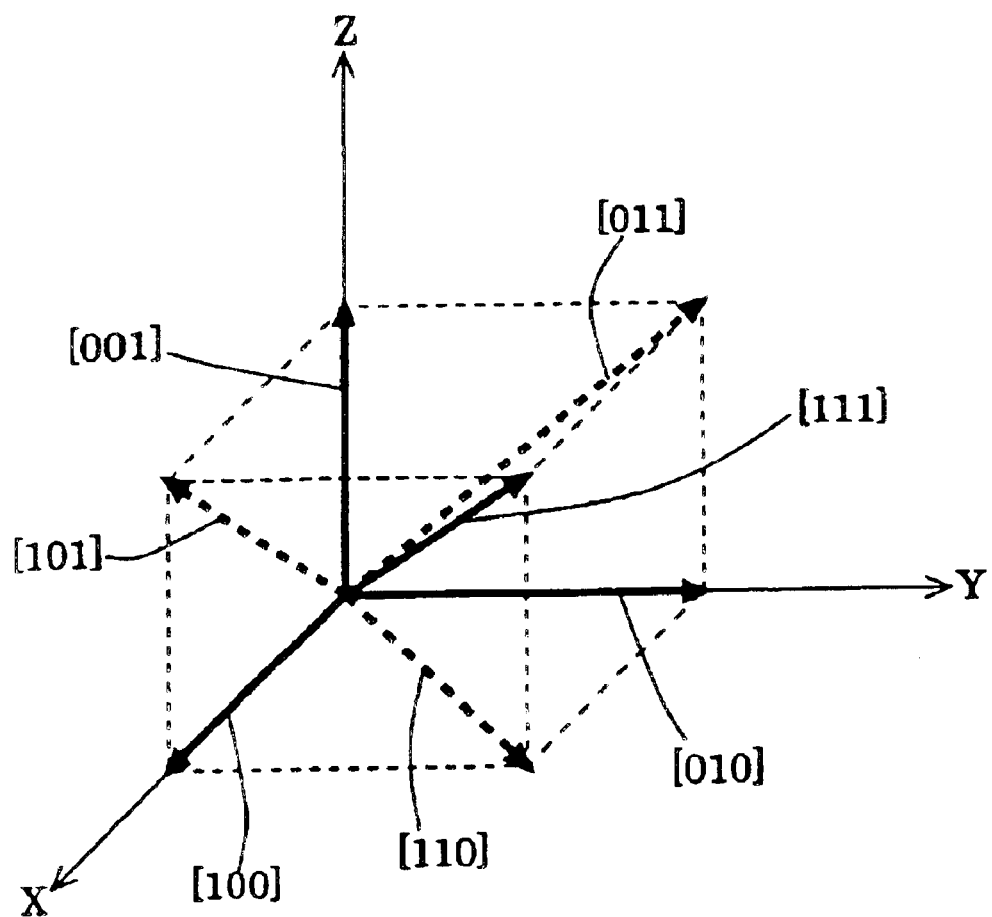
FIG. 1 is a diagram of the crystal axis directions of fluorite.

First, basic methods of the present invention for substantially avoiding the affect of birefringence are described hereinafter. FIG. 1 shows the crystal axis directions of fluorite. The crystal directions are defined based on the XYZ coordinate system of a cubic crystal system. In other words, the crystal axis [100] is defined as the +X axis, the crystal axis [010] is defined as the +Y axis and the crystal axis [001] is defined as the +Z axis.

The crystal axis [101] on the XZ plane is defined as the direction 45 degrees between the crystal axis [100] and the crystal axis [001]. The crystal axis [110] on the XY plane is defined as the direction 45 degrees between the crystal axis [100] and the crystal axis [010]. The crystal axis [011] on the YZ plane is defined as the direction 45 degrees between the crystal axis [001] and the crystal axis [010].

It should be noted that FIG. 1 shows only the crystal axes in the space defined by the +X axis, the +Y axis and the +Z axis, but crystal axes are defined similarly in other spaces. As described above, birefringence is nearly zero (minimal) for fluorite in the crystal axis direction [111], shown as a solid line in FIG. 1, and the equivalent crystal axis directions [−111], [1−11], [11−1] not depicted.

Similarly, birefringence is nearly zero (minimal) in the crystal axis directions [100], [010], [011] shown as bold solid lines in FIG. 1. On the other hand, birefringence is maximum in the crystal axis directions [110], [101], [011] shown as bold dashed lines in FIG. 1, and the equivalent crystal axis directions [−110], [−101], [01−1] not depicted.

Figure 2:
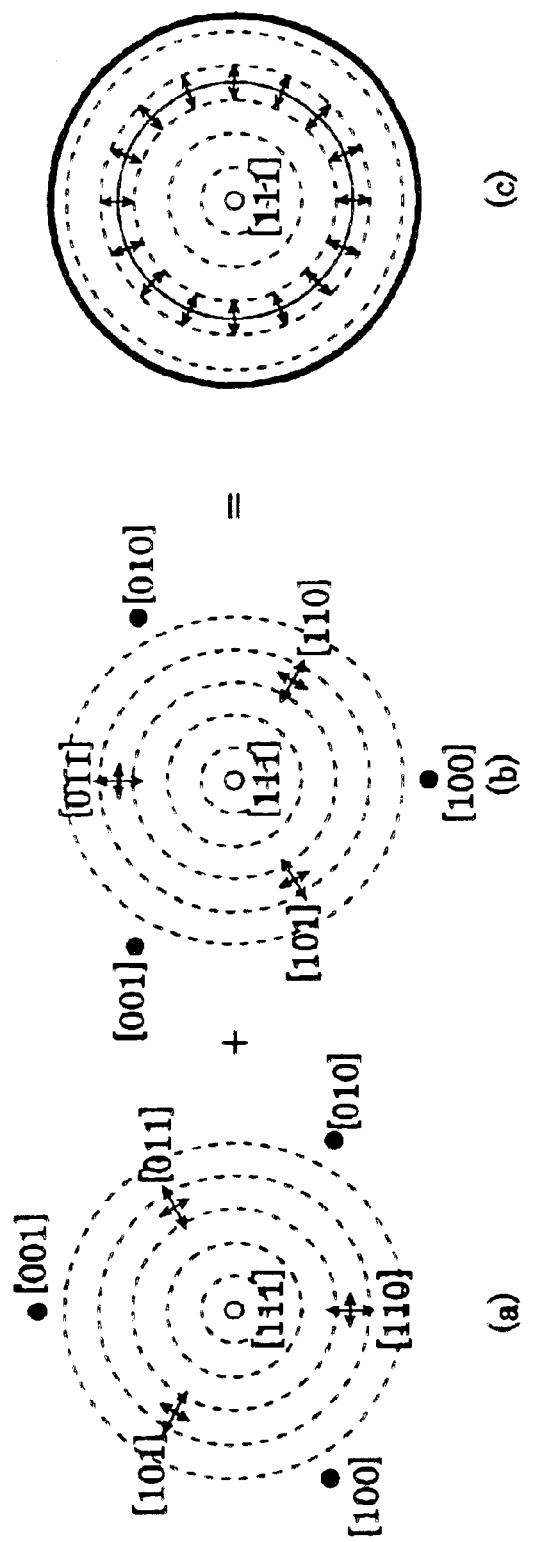
FIG. 2 is a diagram of the method of Burnett et al. and shows the birefringence distribution for light ray incidence angles.

Prior to describing a method of the present invention below, the correction effectiveness for the above-described Burnett et al. method will be verified. FIG. 2 (FIGS. 2(a)–2(c)) shows the Burnett et. al. method and the distribution of the indices of double refraction (birefringence) for light ray incident angles. In FIG. 2, each of the five concentric circles shown as dashed lines represent 10 degrees. Therefore, the innermost circle represents a 10 degree incidence angle relative to the optical axis, and the outermost circle represents a 50 degree incidence angle.

Figure 3:
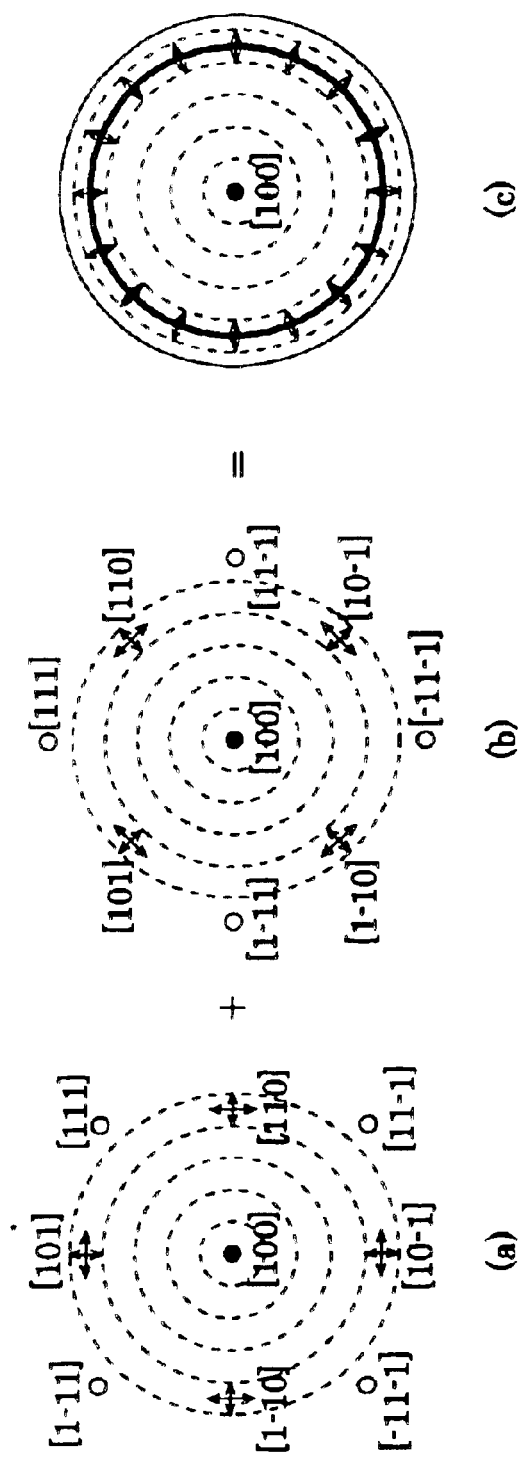
FIG. 3 is a diagram of a first method of the present invention, and shows the birefringence distribution for light ray incidence angles.
Figure 4:
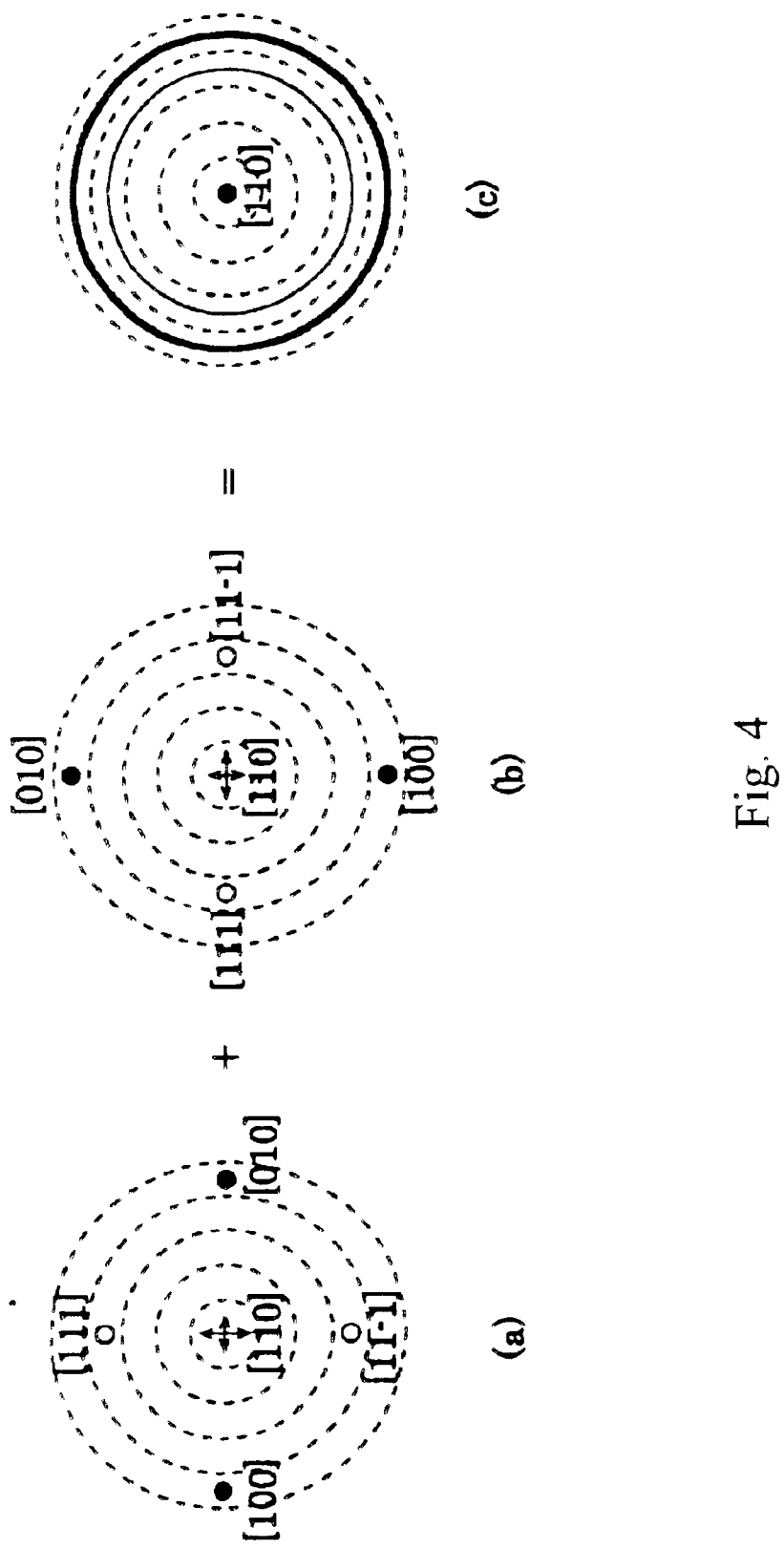
FIG. 4 is a diagram of a third method of the present invention, and shows the birefringence distribution for light ray incidence angles.

Moreover, a black circle represents an area with no birefringence having a comparatively high refractive index, a white circle represents an area with no birefringence having a comparatively low refractive index, the small hatched circle (see FIG. 4(c)) represents an area with no birefringence having an intermediate refractive index. On the other hand, the thick circle and the long double arrows represent the direction of a comparatively high refractive index in the area with birefringence, and the thin circle and short double arrows represent the direction of a comparatively low refractive index in the area with birefringence. The above-described notation is the same for FIGS. 3 and 4.

As described above, the Burnett et al. method aligns the optical axes of a pair of fluorite lenses with the crystal axis [111] and rotates the pair of fluorite lenses relatively 60 degrees around the optical axis. Thus, the distribution of the indices of double refraction in one fluorite lens is shown FIG. 2(a), and the distribution of the indices of double refraction in the other fluorite lens is shown in FIG. 2(b). As a result, the distribution of the indices of double refraction in the pair of fluorite lenses overall are shown in FIG. 2(c).

In this case, with reference to FIGS. 2(a) and (b), the area corresponding to the crystal axis [111] which is aligned with the optical axis is an area with no birefringence having a comparatively low refractive index. Further, the areas corresponding to the crystal axes [100], [010], [001] are areas with no birefringence having a comparatively high refractive index. Furthermore, the areas corresponding to the crystal axes [110], [101], [011] are areas of birefringence where the refractive index of the tangential polarization is comparatively low and the refractive index of the radial polarization is comparatively high. Thus, it is clear that the maximum effect of birefringence Occurs in the area 35.26 degrees from the optical axis (the angle defined by the crystal axis [111] and the crystal axis [110]) in each lens.

On the other hand, with reference to FIG. 2(c), the effect of the crystal axes [110], [101], [011], where birefringence is maximum, can be ameliorated for the pair of fluorite lenses overall by rotating the pair of fluorite lenses relatively 60 degrees. However, in the area 35.26 degrees from the optical axis, in other words, the area comparatively near the optical axis, an area of birefringence remains where the refractive index of tangential polarization is lower than the refractive index of radial polarization. As a result, a certain amount of the effect of birefringence exists with the Burnett et al. method.

A first method of the present invention aligns the optical axis of a first group of lens elements (radiation transmissive members) with the optical axis [100] (or an optically equivalent crystal axis), the optical axis of a second group of lens elements with the optical axis [100] (or an optically equivalent crystal axis), and relatively rotates the first group of lens elements and the second group of lens elements only 45 degrees around the optical axis. Here, the optically equivalent crystal axes to the crystal axis [100] are crystal axes [010], [001].

FIG. 3 shows the first method of the present invention, and the distribution of the indices of double refraction for the angle of incidence of the light ray (the angle between the light ray and the optical axis). In the first method, the distribution of the indices of double refraction in the first group of lens elements is shown in FIG. 3(a), and the distribution of the indices of double refraction in the second group of lens element is shown in FIG. 3(b). As a result, the distribution of the indices of double refraction for the first group of lens elements and the second group of lens elements overall is shown in FIG. 3(c).

Referring to FIGS. 3(a) and 3(b), in the first method, the area corresponding to the crystal axis [100] which is aligned with the optical axis is an area with no birefringence having a comparatively high refractive index. Further, the areas corresponding to the crystal axes [111], [1–11], [−11–1], [11–1] are areas with no birefringence having a comparatively low refractive index. Further, the areas corresponding to crystal axes [101], [10–1], [110], [1–10] are areas of birefringence where the refractive index of the tangential polarization is comparatively high and the refractive index of the radial polarization is comparatively low. Thus, each group of lens elements receives the maximum effect of the indices of double refraction in the area 45 degrees from the optical axis (the angle defined by the crystal axis [100] and the crystal axis [101]).

On the other hand, with reference to FIG. 3(c), by relatively rotating the first group of lens elements and the second group of lens elements 45 degrees around the optical axis, for the first group of lenses and the second group of lenses overall, the effect of crystal axes [101], [10–1], [110], [1–10] where birefringence is maximum, can be fairly well ameliorated, and in the area 45 degrees from the optical axis, in other words, the area separated from the optical axis, an area of birefringence remains where the refractive index of tangential polarization is higher than the refractive index of radial polarization. In this case, the maximum angle of the light beam and the optical path for each lens element in a common projection optical system is about 35 to 40 degrees. Therefore, by adopting the first method, it possible to obtain excellent imaging performance without substantially receiving the effect of the birefringence of crystal axes [101], [10–1], [110], [1–10].

It should be noted that in the first method of the present invention, to relatively rotate the first group of lens elements and the second group of lens elements about 45 degrees around the optical axis means that the relative angle of the predetermined crystal axes (for example, crystal axes [010], [001], [011] or [01–1]), which are facing in different directions from the optical axis in the first group of lens elements and in the second group of lens elements, is about 45 degrees around the optical axis. For example, the relative angle of the crystal axis [010] in the first group of lens elements and of the crystal axis [010] in the second group of lens elements is 45 degrees around the optical axis.

Furthermore, as is clear from FIGS. 3(a) and 3(b), when the crystal axis [100] serves as the optical axis, rotational asymmetry stemming from the effect of birefringence around the optical axis appears at a 90 degree period. Therefore, in the first method, to relatively rotate only about 45 degrees around the optical axis means the same as relatively rotating only about 45 degrees+(n*90 degrees) around the optical axis, that is, 45 degrees, 135 degrees, 225 degrees or 315 degrees (where n is a whole number).

It should be noted that in the description above, the first group of lens elements and the second group of lens elements each have one or a plurality of lenses. When the first group of lens elements or the second group of lens elements include a plurality of lenses, the plurality of lenses are not necessarily continuous lenses. The concept of groups of lens elements applies to the third through the sixth group of lens elements as well. In the first method, the total T1 of the thickness of the first group of lens elements along the optical axis and the total T2 of the thickness of the second group of lens elements along the optical axis are preferably nearly equal.

Also, with reference to FIGS. 2(a) and (b), because the optical axis of the lens elements and the crystal axis [111] are aligned, the areas corresponding to the crystal axes [110], [101], [011] where birefringence is maximum exist at a 120 degree pitch, and it is possible that the effect of birefringence, that is, coma aberrations in the image surface (the wafer surface), having a 3 θ distribution surface may be generated within the pupil. In contrast, with reference to FIGS. 3(a) and (b), because the optical axis of the lens elements and the crystal axis [100] are aligned, the areas corresponding to the crystal axes [101], [10–1], [110], [1–10] where birefringence is maximum exist at a 90 degree pitch, and the effect of birefringence having a 4 θ distribution may appear within the pupil plane.

In this case, because the vertical and horizontal patterns in the pattern to be projected onto the wafer are dominant, if the distribution is 4 θ, astigmatism of the vertical and horizontal patterns is not generated and image degradation is not large. Therefore, by adopting the second method to align the optical axis of at least one lens element with the crystal axis [100] (or an optically equivalent crystal axis), it possible to effectively suppress the effect of birefringence and to obtain excellent imaging performance.

Further, in the third method of the present invention, the optical axis of the third group of lens elements is aligned with the crystal axis [110] (or an optically equivalent crystal axis), the fourth group of lens elements is aligned with the crystal axis [110] (or an optically equivalent crystal axis), and the third group of lens elements and the fourth group of lens elements are relatively rotated only 90 degrees around the optical axis. Here, the optically equivalent crystal axes to the crystal axis [110] are the crystal axes [-110], [101], [-101], [011] and [01-1].

FIG. 4 shows a third method of the present invention, and the distribution of the indices of double refraction for the angle of incidence of the light ray. In the third method, the distribution of the indices of double refraction in the third group of lens elements is shown in FIG. 4(a), and the distribution of the indices of double refraction in the fourth group of lens elements is shown in FIG. 4(b). As a result, the distribution of the indices of double refraction for the third group of lens elements and the fourth group of lens elements overall is shown in FIG. 4(c).

Referring to FIGS. 4(a) and 4(b), in the third method, the area corresponding to the crystal axis [110] which is aligned with the optical axis is a birefringent area with comparatively high refractive index to one direction of polarization and a comparatively low refractive index to the other (the direction orthogonal to the direction of the first) direction of polarization. Further, the areas corresponding to the crystal axes [100] and [010] are areas with no birefringence having a comparatively high refractive index. Furthermore, the areas corresponding to crystal axes [111] and [11-1] are areas with no birefringence having a comparatively low refractive index.

On the other hand, with reference to FIG. 4(c), by relatively rotating the third group of lens elements and the fourth group of lens elements 90 degrees around the optical axis, for the third group of lens elements and the fourth group of lens elements overall, the effect of crystal axis [110] where birefringence is maximum is almost nonexistent, and the area near the optical axis is an area with no birefringence having an intermediate refractive index. In other words, by adopting the third method it is possible to obtain excellent imaging performance without substantially receiving the effect of birefringence.

It should be noted that in the third method of the present invention, to relatively rotate the third group of lens elements and the fourth group of lens elements about 90 degrees around the optical axis means that the relative angle of the predetermined crystal axes (for example, crystal axes [001], [-111], [-110], or [1-11]) which are facing in different directions from the optical axis in the third group of lens elements and the fourth group of lens elements is about 90 degrees around the optical axis. For example, the relative angle of the crystal axis [001] in the third group of lens elements and the crystal axis [001] in the fourth group of lens elements is 90 degrees around the optical axis.

Furthermore, as is clear in FIGS. 4(a) and 4(b), when the crystal axis [110] serves as the optical axis, rotational asymmetry stemming from the effect of birefringence around the optical axis appears at a 180 degree period. Therefore, in the third method, to relatively rotate only about 90 degrees around the optical axis means the same as relatively rotating only about 90 degrees+(n*180 degrees) around the optical axis, that is, 90 degrees, 270 degrees, and so forth (where n is a whole number).

In the third method also, the total T3 of the thickness of the third group of lens elements along the optical axis and the total T4 of the thickness of the fourth group of lens elements along the optical axis are preferably nearly equal. In particular, in the third method, because the birefringent area (the optical axis and its proximal area) is in the center portion, it is preferable that a negative lens with a thin center portion be chosen.

Further, due to the same reason as that described in the above-described second method, by adopting a fourth method which aligns the optical axis of at least one lens element and the crystal axis [110] (or an optically equivalent crystal axis), it possible to effectively suppress the effect of birefringence and to obtain excellent imaging performance.

Moreover, the above-described Burnett et al. method is used as part of a fifth method of the present invention. In this case, the fifth method of the present invention aligns the optical axis of the fifth group of lens elements and the crystal axis [111] (or an optically equivalent crystal axis), aligns the optical axis of the sixth group of lens elements and the crystal axis [111] (or an optically equivalent crystal axis), and relatively rotates the fifth group of lens elements and the sixth group of lens elements only 60 degrees around the optical axis.

As described above, by adopting the fifth method, it is possible to effectively suppress the effect of birefringence and to obtain excellent imaging performance. Here, an optically equivalent crystal axes to crystal axis [111] are crystal axes [-111], [1-11], [11-1].

It should be noted that in the fifth method of the present invention, to relatively rotate the fifth group of lens elements and the sixth group of lens elements about 60 degrees around the optical axis means that the relative angle of the predetermined crystal axes (for example, crystal axes [-111], [11-1], or [1-11]) which are facing in different directions from the optical axis in the fifth group of lens elements and the sixth group of lens elements is about 60 degrees around the optical axis. For example, the relative angle of the crystal axis [-111] in the fifth group of lens elements and the crystal axis [-111] in the sixth group of lens elements is 60 degrees around the optical axis.

Furthermore, as is clear from FIGS. 2(a) and 2(b), when the crystal axis [111] serves as the optical axis, rotational asymmetry stemming from the effect of birefringence around the optical axis appears at a 120 degree period. Therefore, in the fifth method, to relatively rotate only about 60 degrees around the optical axis means the same as relatively rotating only about 60 degrees+(n*120 degrees) around the optical axis, that is, 60 degrees, 180 degrees, 300 degrees, and so forth (where n is a whole number).

In the fifth method, the total T5 of the thickness of the fifth group of lens elements along the optical axis and the total T6 of the thickness of the sixth group of lens elements along the optical axis are preferably nearly equal.

Moreover, as a sixth method of the present invention, it is possible to adopt a method combining portions of methods 1, 3 and 5. In other words, the sixth method of the present invention aligns the optical axis of the first group of lens elements and the crystal axis [100] (or an optically equivalent crystal axis), aligns the optical axis of the third group of lens elements and the crystal axis [110] (or an optically equivalent crystal axis), and aligns the optical axis of the fifth group of lens elements and the crystal axis [111] (or an optically equivalent crystal axis). In this case, it is possible to effectively suppress the effect of birefringence and to obtain excellent imaging performance.

In the present invention, as described below, one of the above-described six methods has been selected and applied to predetermined optical members of the projection optical system. Additionally, in the present invention, it is possible to adopt a combination of a plurality of methods selected from the above-described six methods. Thus, in the present invention, even though birefringent optical materials such as fluorite are used in the projection optical system, it is possible to realize a projection optical system having excellent imaging performance without substantially receiving the effect of birefringence.

It should be noted that in a lens with the crystal axis [111] set in the optical axis direction, polishing errors on the lens surface are easily manifest at every 120 degrees azimuth angle around the optical axis due to the crystal structure. Nevertheless, as in the above-mentioned fifth method, this method has the advantage of making it possible to nearly offset aberrations between the fifth group of lens elements and the sixth group of lens elements resulting from polishing errors on the lens surface at every 120 degrees azimuth angle around the optical axis by aligning the optical axis of the fifth group of lens elements and the crystal axis [111] (or an optically equivalent crystal axis), aligning the optical axis of the sixth group of lens elements and the crystal axis [111] (or an optically equivalent crystal axis), and relatively rotating the fifth group of lens elements and the sixth group of lens elements only 60 degrees around the optical axis.

However, in the present invention, the following conditional expressions (3) through (5) are preferably satisfied in the above-described first method, third method and fifth method.

$$|T1-T2|/TA < 0.025 \quad (3)$$

$$|T3-T4|/TA < 0.025 \quad (3)$$

$$|T5-T6|/TA < 0.025 \quad (3)$$

Here, T1 through T6, as described above, are the totals of the thickness along the optical axis of the first through sixth groups of lenses (radiation transmissive members). Moreover, TA is the total thickness along the optical axis of all the radiation transmissive members comprising the projection optical system. It is not preferable that expressions (3) through (5) are not satisfied because the effect of birefringence becomes high and the imaging performance of the optical system worsens.

Next, according to a different aspect of the present invention, in a catadioptric projection optical system which forms a reduced image of a first surface onto a second surface and includes a plurality of lenses and at least one concave reflective mirror, contamination of the lenses caused by outgas from the photoresist is effectively avoided. For this purpose, the present invention, when used in an exposure apparatus to scan expose the first surface onto the second surface while moving the first surface and the second surface along a scanning direction, forms a slit-shaped or arc-shaped exposure area at the second surface when not scanning; and satisfies the following conditional expression (1).

$$0.5 < (Dw \cdot Nw)/Ew < 1.4 \quad (1)$$

Here, Dw is the working distance (the distance between the second surface and the most second surface side of the closest optical member) of the second surface, Nw is the numerical aperture (the image side numerical aperture) of the second surface and Ew is the length along the non-scanning direction (the direction orthogonal to the scanning direction) in the slit-shaped or arc-shaped exposure area. The conditional expression (1) determines the relationship between the image side working distance, the image side numerical aperture and the image field. If the conditional expression (1) is below the lower limit, then contamination caused by outgas from the photoresist coated on the surface of the photosensitive substrate is greater. On the other hand, if the conditional expression (1) is above the upper limit, then not only does it become difficult to correct chromatic aberration, but it is impossible to avoid increasing the size of the optical elements, and optical system manufacture becomes difficult. It should be noted that to further demonstrate the excellent effect of the present invention, the lower limit of the conditional expression is preferably 0.53 and the upper limit is 1.3.

Also, in the above-described catadioptric projection optical system, the slit-shaped or arc-shaped exposure area is set such that the optical axis of the projection optical system is not included (i.e., the optical axis does not pass through the exposure area), and the above-described catadioptric projection optical system is provided with a refractive type first optical imaging system to form a first intermediate image of the first surface; a second optical imaging system, having at least one negative lens and a concave reflective mirror, to form the first intermediate image into a second intermediate image of nearly the same magnification near the first intermediate image forming position, based on the light beam from the first intermediate image; a refractive type third optical imaging system to form a reduced image of the second intermediate image onto the second surface based on the light beam from the second intermediate image; a first optical path folding mirror arranged in the optical path between the first optical imaging system and the second optical imaging system; and a second optical path folding mirror arranged in the optical path between the second optical imaging system and the third optical imaging system.

Then, the effective area (clear aperture) of the first optical path folding mirror and the effective area (clear aperture) of the second optical path folding mirror preferably have a reflective surface formed across the whole of the planar surface. It is preferable that the effective area of the first optical path folding mirror and the second optical-path folding mirror not have a spatial overlap, and are arranged such that the whole light beam from the first surface is guided to the second surface. With this structure, it is possible to effectively correct chromatic aberration with only a radiation transmissive member of a single type such as fluorite. Further, in the above-described catadioptric type projection optical system, all lenses comprising the first optical imaging system and the third optical imaging system are preferably arranged along the single straight line of the optical axis. With this structure, assembly adjustment is comparatively easy and it is possible to manufacture an optical system with excellent precision.

Next, according to yet another aspect of the present invention, the projection optical system in the present invention includes a plurality of lenses, a concave reflective mirror and a negative lens arranged in proximity to the concave reflective mirror, and is capable of forming a reduced image of a first surface onto a second surface. Also, the projection optical system moves the first surface and the second surface in a scanning direction and, when used in an exposure apparatus to scan expose the image of a first surface onto a second surface, it forms a slit-shaped or arc-shaped exposure area at the second surface when not scanning, and the numerical aperture of the second surface side is 0.82 or more.

In this case, a concave reflective mirror and a negative lens are arranged along an optical axis in a direction substantially different from the direction of gravity, and the following conditional expression (2) is preferably satisfied.

$$1.0 < S/|R| < 1.8 \qquad (2)$$

In the conditional expression (2), S is the clear aperture (diameter) of the concave reflective mirror and R is the radius of curvature of the concave reflective mirror.

By satisfying the conditional expression (2), it is possible to substantially suppress deformation due to the gravity of the concave reflective mirror and to ease manufacture. In other words, it is not preferable that the value of the conditional expression (2) fall below the lower limit because the deformation of the concave reflective lens due to gravity increases and assembly adjustment and working difficulty increases. On the other hand, it is not preferable that the value of the conditional expression (2) rise above the upper limit because it becomes impossible to correct chromatic aberration and field curvature while assuring a large numerical aperture. It should be noted that to further demonstrate the excellent effect of the present invention, the lower limit value of the conditional expression is preferably 1.1 and the upper limit value 1.65.

Next, exemplary embodiments of the present invention will be described based on the diagrams.

Figure 5:
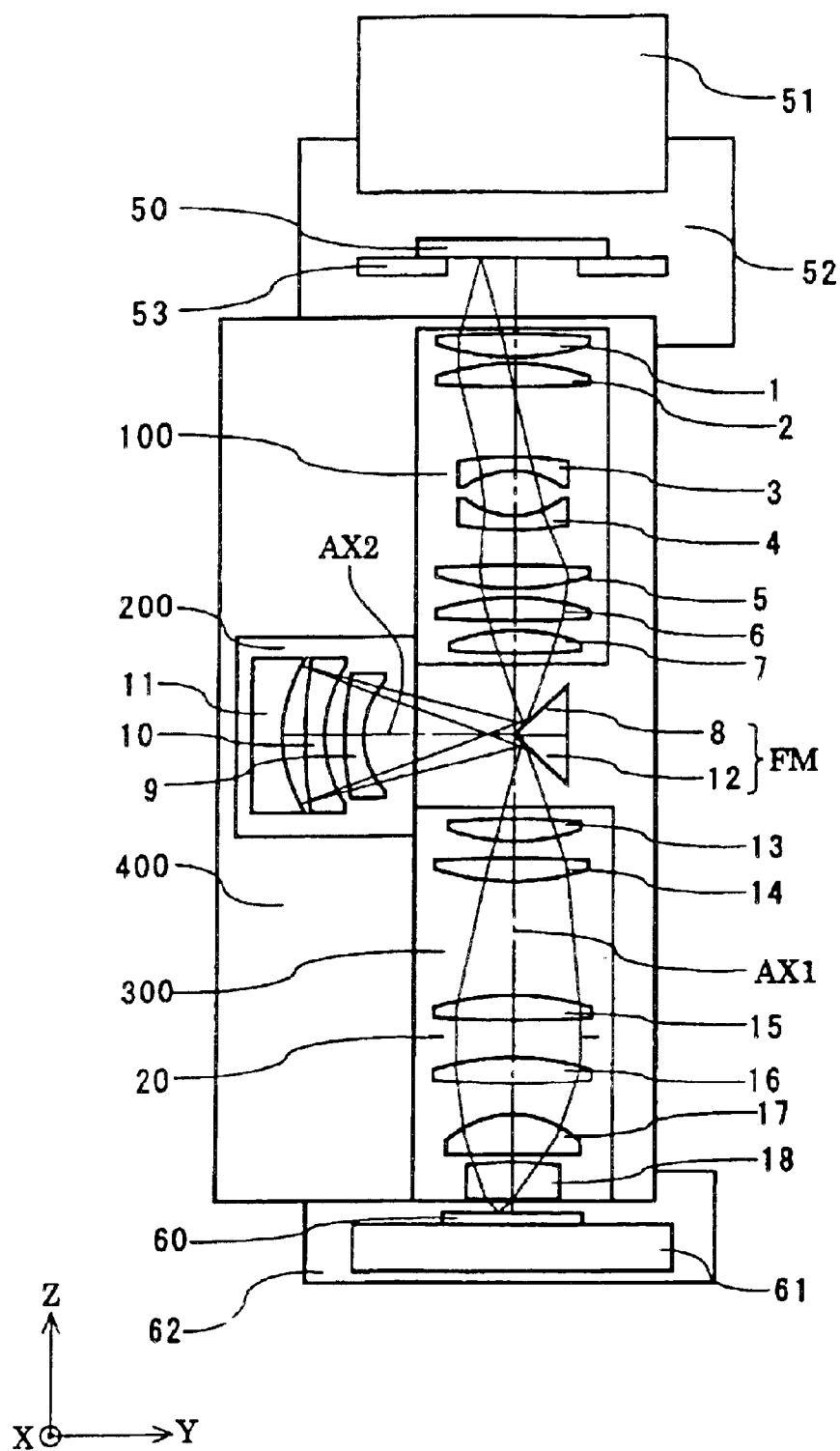
FIG. 5 is a schematic diagram of an exposure apparatus provided with an optical system in the various embodiments of the present invention.

FIG. 5 shows a schematic view of the structure of an exposure apparatus provided with the projection optical system of an exemplary embodiment of the present invention. It should be noted that in FIG. 5, the Z-axis is the wafer normal line direction, the Y-axis is parallel to the FIG. 5 page surface and is perpendicular to the Z-axis, and the X-axis is perpendicular to the FIG. 5 page surface and perpendicular to the Z-axis. In the present exemplary embodiment, the present invention is applied to a scanning projection exposure apparatus provided with a catadioptric projection optical system.

With reference to FIG. 5, the exposure apparatus in the present embodiment provides an illumination apparatus 51 for illuminating a reticle (mask) 50 arranged on a first surface. The illumination apparatus 51 has a light source having an $F_2$ laser, for example, to supply a light with a 157 nm wavelength, an optical integrator to form a secondary light source of a predetermined shape (circular, annular, bipolar, quadrupolar or the like) with the light from this light source, an illumination field stop for determining the illumination range on the reticle 50 and illuminates the illumination area on the reticle 50 with a nearly uniform illumination distribution.

Here, the illumination optical path in the illumination apparatus 51 is preferably purged with an inert gas. The present embodiment purges with nitrogen. The reticle 50 is disposed on the reticle stage 53 and the reticle 50 and the reticle stage 53 are separated from the external atmosphere by the casing 52. The inner space of this casing 52 is preferably purged with an inert gas, and the present embodiment purges with nitrogen.

The light from the reticle 50 illuminated by the illumination apparatus 51 is guided to the wafer 60 serving as a photosensitive substrate via the projection optical system 400 having a plurality of lens elements (1–7, 9, 10, 13–18) formed with fluorite crystal, a concave reflective mirror 11 and an aperture stop 20 or the like to control the coherence factor (σ value), and the reticle 50 pattern image is formed in the exposure area at wafer 60. The projection optical path in the projection optical system 400 is preferably purged with an inert gas. The present embodiment purges with helium.

The wafer 60 is disposed on the wafer stage 61 such that the wafer surface is positioned on the second surface serving as the image plane of the projection optical system 400, and the wafer 60 and the wafer stage 61 are separated from the external atmosphere by the casing 62. The inner space of this casing 62 is preferably purged with an inert gas. The present embodiment purges with nitrogen. Also, the pattern on the reticle 50 is transferred onto the exposure area of the wafer 60 by illuminating the reticle 50 while moving the reticle stage 53 and the wafer stage 61 along the Y-axis, which is the scanning direction, relative to the projection optical system 400 at a speed ratio corresponding to the magnification of the projection optical system 400.

Figure 6:
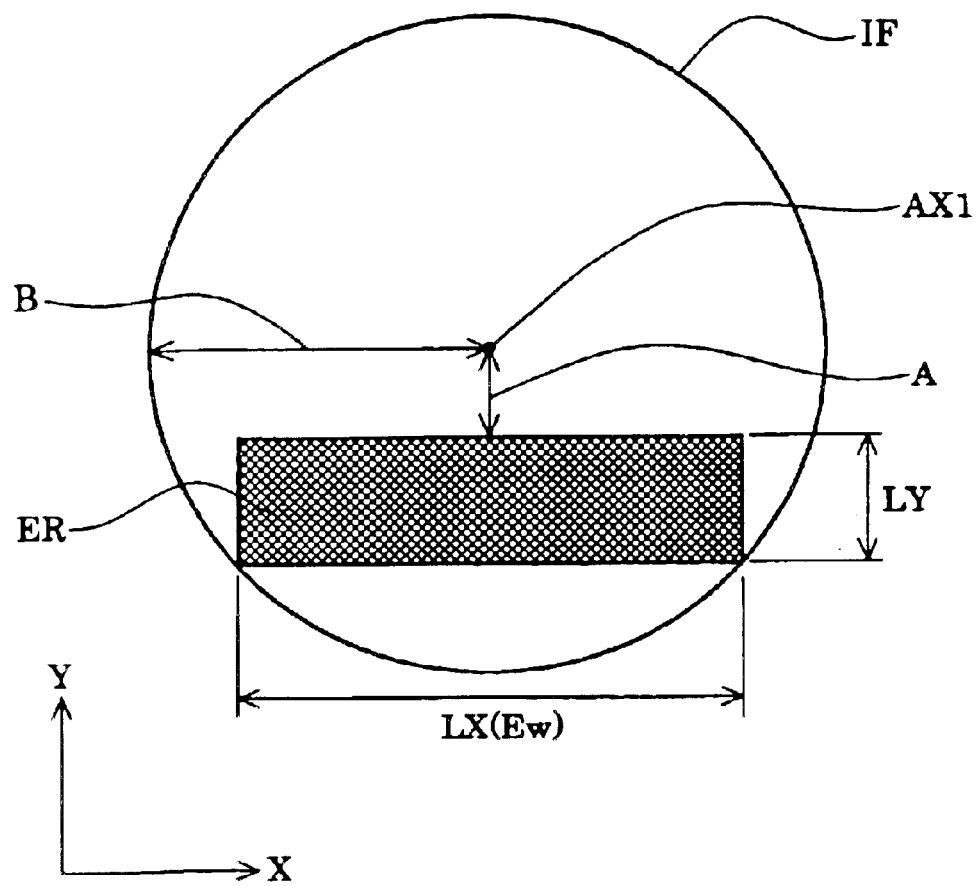
FIG. 6 is a diagram of the positional relationship between the optical axis and the rectangular-shaped exposure area (in other words, the effective exposure area) formed on a wafer.

FIG. 6 shows the positional relationship between the optical axis and the rectangular exposure area (that is, the effective exposure area) formed at a wafer. As shown in FIG. 6, in the present embodiment, in the circular area (the image circle) IF having a radius B with the optical axis AX1 serving as the center, a rectangular effective exposure area ER, having a desired size in a position separated by an off-axis amount A in the −Y direction from the optical axis AX1, is determined. Here, LX (Ew) is the length in the X direction of the effective exposure area, and LY is the length in Y direction of the same.

In other words, in this embodiment, a rectangular effective exposure area ER, having a desired size in a position separated by an off-axis amount A in the −Y direction from the optical axis AX1, is determined, and around the optical axis of the circular image circle IF the radius B is predetermined such that the effective exposure area ER is contained within the circular image circle IF. Thus, in contrast, a rectangular illumination area (that is, the effective illumination area) having a shape and size corresponding to the effective exposure area in a position separated by an off-axis amount A in the −Y direction from the optical axis AX1 is formed at reticle 50.

With reference to FIG. 5 again, the projection optical system in the present embodiment is provided with a refractive first optical imaging system 100 to form a first intermediate image of the reticle 50 pattern arranged on the first surface, a second optical imaging system 200 comprised of a concave reflecting mirror 11 and two negative lenses 9, 10 to form a second intermediate image (a secondary image of the reticle pattern at a magnification nearly equal to the first intermediate image) at a magnification nearly equal to the first intermediate image, and refractive third optical imaging system 300 to form the final image of the reticle pattern (the reduced image of the reticle pattern) at the wafer 60 arranged on the second surface based on the light from the second intermediate image.

It should be noted that a first folding mirror 8 for deflecting the light from the first optical imaging system 100 toward the second optical imaging system 200 is arranged in proximity to the forming position of the first intermediate image in the optical path between the first optical imaging system 100 and the second optical imaging system 200.

Also, a second folding mirror 12 for deflecting the light from the second optical imaging system 200 toward the third optical imaging system 300 is arranged in proximity to the forming position of the second intermediate image in the optical path between the second optical imaging system 200 and the third optical imaging system 300. The first intermediate image and the second intermediate image are formed in the optical path between the first optical path folding mirror 8 and the second optical imaging system 200, and in the optical path between the second optical imaging system 200 and the second optical path folding mirror 12 respectively.

Further, both the first optical imaging system 100 and the third optical imaging system 300 have a single optical axis extended in a straight line, that is, a standard optical axis AX1. The standard optical axis AX1 is positioned along the direction of gravity (that is, the vertical direction). As a result, the reticle 50 and the wafer 60 are both arranged parallel along the surface orthogonal to the direction of gravity, that is, the horizontal plane. In addition, all the lenses comprising the first optical imaging system 100 and all the lenses comprising the third optical imaging system 300 are arranged along horizontal planes at the standard optical axis AX1.

On the other hand, the second optical imaging system 200 also has an optical axis AX2 extended in a straight line and this optical axis AX2 is set such that it is orthogonal to the standard optical axis AX1. Furthermore, both the first optical path folding mirror 8 and the second optical path folding mirror 12 have a reflective surface on a planar surface, and are integrally structured as one optical member (one optical path folding mirror FM) having two reflective surfaces. The lines of intersection (strictly speaking, the intersecting lines of the virtual extended planes) of these two reflective surfaces are set such that the optical axis AX1 of the first optical imaging system 100 and the third optical imaging system 300, and the optical axis AX2 of the second optical imaging system 200 intersect at one point.

In the present embodiment, the concave reflective mirror 11 and the negative lenses 9, 10 in the second optical imaging system compensate for chromatic aberration and the positive Petzval sum generated by the first optical imaging system 100 and the third optical imaging system 300 which are refractive optical systems including a plurality of lenses. Also, it is possible to form a second intermediate image in proximity to the first intermediate image when a second optical imaging system 200 has a structure with an imaging magnification of nearly unit (equal) magnification. In the present working embodiments, it is possible to reduce the distance of the exposure area (that is, the effective exposure area) from the optical axis, in other words, the off-axis amount by an optical path separation in proximity to these two intermediate images. This is not only advantageous for aberration correction, but also for size reduction, optical adjustment, machine design and manufacturing costs.

As described above, the second optical imaging system 200 alone holds the burden of compensating for the chromatic aberration and the Petzval sum generated by the first optical imaging system 100 and the third optical imaging system 300. This means it is preferable to set the power of the concave reflection mirror 11 and the negative lenses 9, 10 comprising the second optical imaging system 200 high. Thus, when the symmetry of the second optical imaging system 200 deteriorates, the generation of asymmetrical chromatic aberration such as magnification chromatic aberration and chromatic coma aberration becomes higher, and a sufficient resolving power cannot be obtained. Therefore, in the present embodiment, by adopting a structure capable setting the imaging magnification of the second optical imaging system to nearly unit magnification and capable of arranging a concave reflective mirror 11 in the proximity of the pupil position, excellent asymmetry is obtained and generation of the above-described asymmetrical chromatic aberration is successfully prevented.

Hereinafter, the application of the present embodiment of the method in the present invention to substantially avoid the effect of birefringence will be described. First, with the lenses (16–18) arranged in the optical path between wafer 60 and the aperture stop 20 arranged in the pupil position of the wafer side (the second surface side), there is a tendency for the maximum angle of the transmitting light ray to the optical axis to be large and it is easy to receive the effect of birefringence. Therefore, in the present embodiment, by applying methods one through six of the present invention described above in combination or alone, it is possible to obtain excellent optical characteristics without substantially receiving the effect of birefringence. It should be noted that in FIG. 5 only three lenses can be arranged between the aperture stop 20 and the wafer 60 to simplify the diagram, but more lenses can be arranged in actual design.

Also, in a lens where the maximum angle of the transmitting light ray is greater than 20 degrees to the optical axis, it is easy to receive the effect of birefringence in spite of its arranged position. Therefore, in the present embodiment, by applying methods one through six of the present invention described above in combination or alone in a lens where the maximum angle of the transmitting light ray is greater than 20 degrees to the optical axis, it is possible to obtain excellent optical characteristics without substantially receiving the effect of birefringence.

Furthermore, in a projection optical system in the present embodiment with a large numerical aperture on the image side, the maximum angle to the optical axis of the transmitting light ray in negative lenses 9, 10 arranged in proximity to a concave reflective mirror 11 often becomes large for the purpose of aberration correction. Thus, in the present embodiment, by applying methods one through six of the present invention to these lenses 9, 10, it is possible to obtain excellent optical characteristics without substantially receiving the effect of birefringence. It should be noted that when the number of negative lenses arranged in proximity to the concave reflective mirror 11 is greater, methods one through six of the present invention may be applied in combination or alone.

It should also be noted that, as described above, when applying the first method, the third method and the fifth method of the present invention, conditional expressions (3)–(5) are preferably satisfied between the first lens group, the third lens group, the fifth lens group and between the second lens group, the fourth lens group, the sixth lens group. Further, when applying the first method, the third method and the fifth method of the present invention, the first lens group (or the third lens group; or the fifth lens group) and the second lens group (or the fourth lens group; or the sixth lens group) are preferably formed as one optical member by optical contact or by adhesion. This structure is advantageous because it limits the number of antireflective coats, as is used in an optical system using a $F_2$ laser in particular, because it is possible to keep the number of optical surfaces on which an antireflective coat is to be formed to a minimum.

However, when applying the first method, the third method and the fifth method of the present invention, azimuth indicating is required between the first lens group (or the third lens group; or the fifth lens group) and the second lens group (or the fourth lens group; or the sixth lens group). Thus, an aspherical surface that originally requires azimuth indicating, that is, the aspherical surface (an aspherical surface of rotational asymmetric about the optical axis) for correcting aberration at the time of lens adjustment is preferably used in the first lens group (or the third lens group; or the fifth lens group) or the second lens group (or the fourth lens group; or the sixth lens group). In this case, even if a rotational asymmetrical scalar aberration occurs due to birefringence, it is possible to correct it with an effect of the aspherical surface. Hereinafter, the aspherical surface for aberration correction at the time of lens adjustment will be described. When manufacturing a projection optical system, the position or posture of an optical element such as a lens or a reflective mirror or the like comprising a projection optical system is adjusted while measuring aberrations such as a wavefront aberration or the like and the optical characteristics of a projection optical system are steered to a desired value. However, only low order aberrations represented by Siedel aberrations can be corrected by adjusting the position or posture of an optical element in such a manner. Therefore, for measured projection optical system aberrations, residual aberrations, except for the component correctable by adjusting the position or posture of an optical element, is corrected by modifying the surface form of an optical element comprising a projection optical system, that is, using an aspherical surface. This kind of aspherical surface used for correcting residual aberrations is called an aspherical surface for correcting aberrations at the time of lens adjustment, and a typical aspherical surface form is a rotational asymmetric form relative to the optical axis. Therefore, in order to build an optical element provided with an aspherical surface for correcting aberrations at time of lens adjustment into an optical system, it is necessary to determine the azimuth angle around the optical axis, that is, perform azimuth indicating.

Furthermore, even when the above-mentioned process by Burnett et al. and the first-sixth processes of this invention are applied to a specified optical member of a projection optical system, there are cases in which polarization aberration, that is, the phase difference between light of a first polarization component going through the projection optical system and light of a second polarization component, different from the first polarization component, cannot be completely corrected.

At this time, by arranging a film which decreases polarization aberration, that is, a film having a characteristic of decreasing the phase difference between the first and second polarization components, on a surface of one or more of the optical members among the optical members constituting the projection optical system, it is possible to further correct the polarization aberration.

Further, in the present embodiment, also effective is the method to form a crystal coat formed with fluorite crystal in the same manner as the surface of the lens formed with fluorite crystal, and set it such that the crystal direction of the fluorite lens and the crystal direction of the crystal coat are substantially different. In this case, it is set such that the crystal direction along the optical axis of the fluorite lens and the crystal direction along the optical axis of the crystal coat are substantially different. Alternatively, the crystal direction along the optical axis of the fluorite lens and the crystal direction along the optical axis of the crystal coat nearly align, and are set such that the fluorite lens and the crystal coat have a positional relationship relatively rotated only to a predetermined angle around the optical axis. With this structure, it is possible to obtain excellent optical characteristics without substantially receiving the effect of birefringence.

Hereinafter, working examples are described based on specific numbers. In each working example, fluorite ($CaF_2$) is used in all refractive optical members (lens components) comprising the projection optical system. Also, the center oscillation wavelength of the $F_2$ laser light being the exposure light is 157.6244 nm, and the refractive index of $CaF_2$ in proximity to 157.6244 nm changes at a rate of $-2.6*10^{-6}$ per +1 pm wavelength change, and changes at a rate of $+2.6*10^{-6}$ per −1 pm wavelength change. In other words, in proximity to 157.6244 nm, the distribution of the refractive index $(dn/d\lambda)$ of $CaF_2$ is $2.6*10^{-6}$/pm.

Therefore, in each working example, the refractive index of $CaF_2$ for a center wavelength of 157.6244 nm is 1.5593067, the refractive index of $CaF_2$ for 157.6244 nm+1 pm=157.6254 nm is 1.5593041, and the refractive index of $CaF_2$ for 157.6244 nm−1 pm=157.6234 nm is 1.5593093.

Also, in each working example, an aspherical surface is described in the following equation (a), where y is the height in the perpendicular direction to the optical axis, z is the distance along the optical axis from the tangent plane at the vertex of the aspherical surface to the position on the aspherical surface at height y (the sag amount), r is the radius of curvature at vertex, κ is the constant of the cone, and Cn is the nth order of the aspherical coefficient.

Formula 1

$$z=(y^2/r)/(1+(1-(1+\kappa)\cdot y^2/r^2)^{1/2})$$
$$+C_4\cdot y^4+C_6\cdot y^6\cdot C_8\cdot y^8+C_{10}\cdot y^{10}+C_{12}\cdot y^{12}+C_{14}\cdot y^{14} \qquad (a)$$

In the working examples, the lens surfaces formed in an aspherical shape are marked with an asterisk on the right side of the surface number.

FIRST WORKING EXAMPLE

Figure 7:
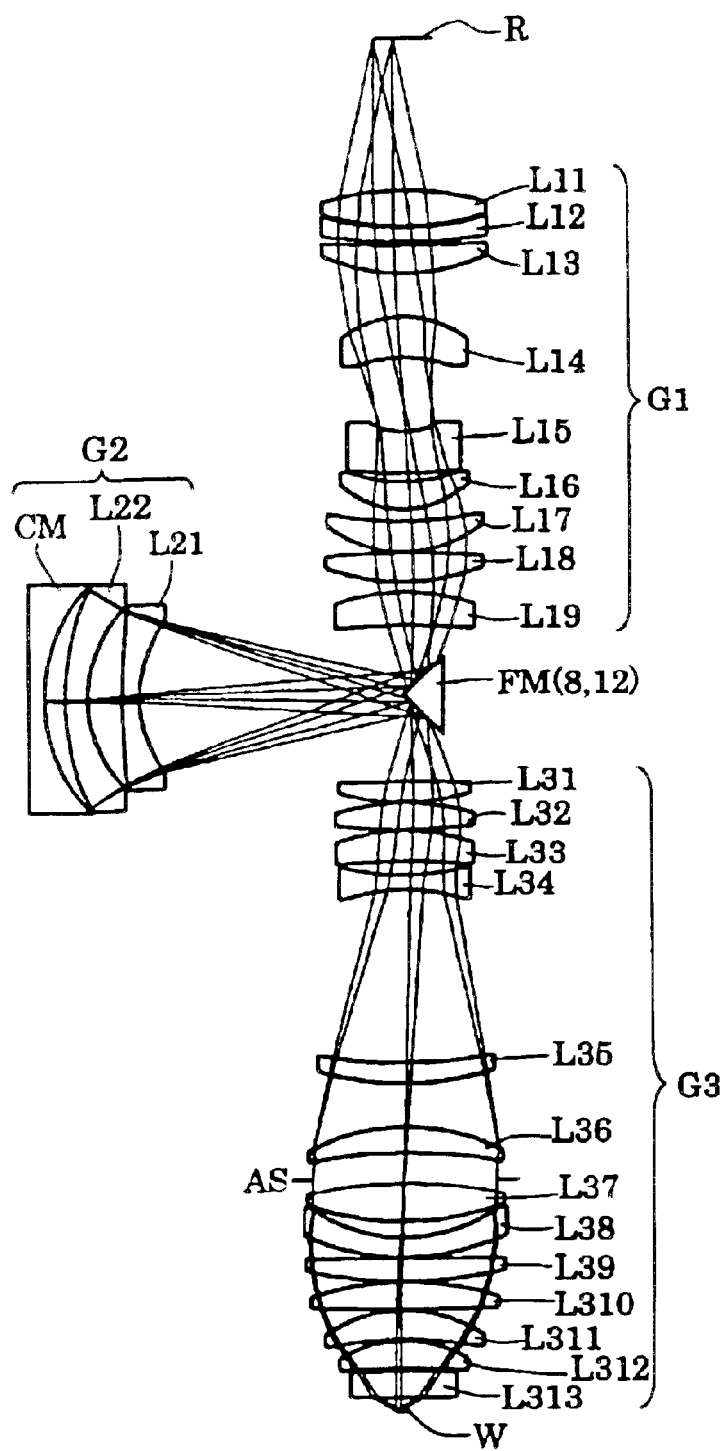
FIG. 7 is a diagram of the lens structure of the projection optical system PL in the first example.

FIG. 7 shows the lens structure of the projection optical system in the first working example. It should be noted that in the first working example, the present invention is applied to a projection optical system wherein various aberrations including a chromatic aberration for an exposure light with a wavelength width of 157.6244 nm±1 pm have been corrected.

In the projection optical system in FIG. 7, the first optical imaging system G1 (corresponding to 100 in FIG. 5) is comprised of, in order from the reticle R (corresponding to 50 in FIG. 5), a biconvex lens L11, a negative meniscus lens L12 with the aspherical concave surface facing the reticle side, a positive meniscus lens L13 with concave surface facing the reticle side, a positive meniscus lens L14 with the aspherical concave surface facing the wafer W (corresponding to 60 in FIG. 5) side, a negative meniscus lens L15 with the concave surface facing the reticle side, a positive meniscus lens L16 with the concave surface facing the reticle side, a positive meniscus lens L17 with the concave surface facing the reticle side, a biconvex lens L18, and a positive meniscus lens L19 with the aspherical concave surface facing the wafer side.

Also, the second optical imaging system G2 (corresponding to 200 in FIG. 5) is comprised of, in order from the reticle side (that is, the entrance side) along the light progression path to the second optical system G2, a negative meniscus lens L21 with the aspherical concave surface facing the reticle side, a negative meniscus lens L22 with the concave surface facing the reticle side, and a concave reflective mirror CM (corresponding to 11 in FIG. 5) with the concave surface facing the reticle.

Further, the third optical imaging system G3 (corresponding to 300 in FIG. 5) is comprised of, in order from the reticle side along the light progression direction, a positive meniscus lens L31 with the concave surface facing the reticle, a biconvex lens L32, a positive meniscus lens L33 with the convex surface facing the reticle side, a biconcave lens L34 with the aspherical surface facing the reticle side, a positive meniscus lens L35 with the aspherical concave surface facing the reticle side, a positive meniscus lens L36 with the aspherical concave surface facing the wafer side, an aperture stop AS, a biconvex lens L37, a negative meniscus lens L38 with the concave surface facing the reticle side, a planoconvex lens L39 with the flat surface facing the reticle side, a biconvex lens L310, a positive meniscus lens L311 with the aspherical concave surface facing the wafer side, a positive meniscus lens L312 with the convex surface facing the reticle side, and a planoconvex lens L313 with the flat surface facing the wafer side.

The following table (1) shows the various values of the projection optical system in the first working example. In table (1), λ is the center wavelength of the exposure light, β is the projection magnification (the imaging magnification of the whole system), NA is the numerical aperture of the image side (the wafer side), B is the radius of the image circle IF on the wafer W, A is the off-axis amount of the effective exposure area ER, LX (Ew) is the dimension (the long side dimension) along the X direction of the effective exposure area ER, and LY is the dimension (the short side dimension) along the Y direction of the effective exposure area ER.

Also, the surface numbers represent the order of surfaces from the reticle side along the direction of the progression of the light ray from the reticle surface being the object surface (the first surface) to the wafer surface being the image surface (the second surface); r is the curvature radius of each surface (in the case of an aspherical surface the radius of curvature at vertex: mm); d is the axial spacing, that is, the surface spacing (mm); and n is the refractive index to the center wavelength. It should be noted that the sign for, surface spacing d is changed for each reflection. Therefore, the sign for surface spacing d is negative in the optical path from the reflective surface of the first optical path folding mirror 8 to the concave reflective mirror CM and in the optical path from the reflective surface of the second optical path folding mirror 12 to the image surface, the sign is positive in other optical paths.

Further, for first optical imaging system G1, the curvature radii of convex surfaces facing the reticle side are positive, and the curvature radii of the concave surfaces are negative. On the other hand, for the third optical imaging system G3, the curvature radii of concave surfaces facing the reticle side are positive, and the curvature radii of the convex surfaces are negative. Furthermore, for second optical imaging system G2, the curvature radii of concave surfaces facing the reticle side (that is, the entrance side) along the light progression path are positive, and the curvature radii of the convex surfaces are negative.

The notations for table (1) described above are the same for table (2) below.

TABLE 1

(Principal Dimensions)

| | |
|---|---|
| λ = | 157.6244 nm |
| β = | −0.25 |
| NA = | 0.84 |
| B = | 13.7 mm |
| A = | 3 mm |
| LX (Ew) = | 22 mm |
| LY = | 5 mm |

(Dimensions of Optical Members)

| Surface Number | r | d | n |
|---|---|---|---|
| | (reticle surface) | 180.6367 | |
| 1 | 338.1128 | 43.1828 | 1.5593067 (lens L11) |
| 2 | −344.9356 | 1.0000 | |
| 3* | −599.9988 | 18.0000 | 1.5593067 (lens L12) |
| 4 | −750.0000 | 3.8448 | |
| 5 | −3025.0000 | 33.6610 | 1.5593067 (lens L13) |
| 6 | −248.3324 | 52.8928 | |
| 7 | 123.3512 | 50.0000 | 1.5593067 (lens L14) |
| 8* | 137.9069 | 94.2897 | |
| 9 | −79.1554 | 50.0000 | 1.5593067 (lens L15) |
| 10 | −622.2967 | 11.3371 | |
| 11 | −184.1414 | 33.8374 | 1.5593067 (lens L16) |
| 12 | −113.4803 | 14.3635 | |
| 13 | −449.4836 | 38.4631 | 1.5593067 (lens L17) |
| 14 | −145.4454 | 1.0000 | |
| 15 | 990.3950 | 35.4539 | 1.5593067 (lens L18) |
| 16 | −266.8459 | 13.1001 | |
| 17 | 230.4657 | 43.1276 | 1.5593067 (lens L19) |
| 18* | 905.8792 | 86.0000 | |
| 19 | ∞ | −322.8159 | (First Optical Path Folding Mirror 8) |
| 20* | 160.0000 | −20.0000 | 1.5593067 (lens L21) |
| 21 | 1029.3354 | −39.7098 | |
| 22 | 170.0000 | −27.0000 | 1.5593067 (lens L22) |
| 23 | 335.4155 | −25.7429 | |
| 24 | 211.5661 | 25.7429 | (Concave Reflective Mirror CM) |
| 25 | 335.4155 | 27.0000 | 1.5593067 (lens L22) |
| 26 | 170.0000 | 39.7098 | |
| 27 | 1029.3354 | 20.0000 | 1.5593067 (lens L21) |
| 28* | 160.0000 | 322.8159 | |
| 29 | ∞ | −109.1661 | (Second Optical Path Folding Mirror 12) |
| 30 | −2979.2971 | −27.9776 | 1.5593067 (lens L31) |
| 31 | 259.8472 | −1.0000 | |
| 32 | −274.0559 | −32.1994 | 1.5593067 (lens L32) |
| 33 | 788.0182 | −1.0000 | |
| 34 | −226.6395 | −40.0000 | 1.5593067 (lens L33) |
| 35 | −775.7225 | −17.4073 | |
| 36* | 286.8379 | −18.0000 | 1.5593067 (lens L34) |
| 37 | −220.3372 | −218.2160 | |
| 38* | 800.0000 | −25.0000 | 1.5593067 (lens L35) |
| 39 | 369.0625 | −55.3479 | |
| 40 | −246.4360 | −31.1478 | 1.5593067 (lens L36) |
| 41* | −707.1086 | −33.8357 | |
| 42 | ∞ | −5.0000 | (Aperture Stop AS) |
| 43 | −541.3470 | −46.1825 | 1.5593067 (lens L37) |
| 44 | 339.2085 | −20.2043 | |
| 45 | 186.8545 | −25.0000 | 1.5593067 (lens L38) |
| 46 | 270.5486 | −1.0000 | |
| 47 | ∞ | −27.9903 | 1.5593067 (lens L39) |
| 48 | 513.9686 | −1.0000 | |
| 49 | −361.1692 | −33.6260 | 1.5593067 (lens L310) |
| 50 | 3025.0000 | −1.0000 | |
| 51 | −154.7547 | −37.2001 | 1.5593067 (lens L311) |
| 52* | −576.9675 | −1.0000 | |
| 53 | −139.4272 | −33.3665 | 1.5593067 (lens L312) |
| 54 | −736.4201 | −3.6217 | |
| 55 | −1640.0282 | −32.3202 | 1.5593067 (lens L313) |
| 56 | ∞ | −17.0000 | |
| | (wafer surface) | | |

TABLE 1-continued (aspherical surface data)

Surface 3

$\kappa = 0.000000$
$C_4 = -6.00493 \times 10^{-8}$  $C_6 = 5.77252 \times 10^{-13}$
$C_8 = 1.82616 \times 10^{-18}$  $C_{10} = -4.73328 \times 10^{-22}$
$C_{12} = 5.51714 \times 10^{-27}$  $C_{14} = 5.08985 \times 10^{-32}$ Surface 8

$\kappa = 0.000000$
$C_4 = -2.03240 \times 10^{-7}$  $C_6 = -2.35744 \times 10^{-12}$
$C_8 = 2.48815 \times 10^{-15}$  $C_{10} = -3.92416 \times 10^{-20}$
$C_{12} = -3.37603 \times 10^{-23}$  $C_{14} = 3.13488 \times 10^{-27}$ Surface 18

$\kappa = 0.000000$
$C_4 = 1.02293 \times 10^{-8}$  $C_6 = -3.13320 \times 10^{-14}$
$C_8 = 7.13401 \times 10^{-18}$  $C_{10} = -1.64420 \times 10^{-21}$
$C_{12} = 3.02692 \times 10^{-25}$  $C_{14} = -2.18460 \times 10^{-29}$ Surface 20
(Same surface as surface 28)

$\kappa = 0.000000$
$C_4 = -1.78974 \times 10^{-8}$  $C_6 = -3.14469 \times 10^{-13}$
$C_8 = -1.08289 \times 10^{-17}$  $C_{10} = 1.61279 \times 10^{-22}$
$C_{12} = -3.64258 \times 10^{-26}$  $C_{14} = 2.91534 \times 10^{-30}$ Surface 36

$\kappa = 0.000000$
$C_4 = -2.10087 \times 10^{-8}$  $C_6 = -4.27300 \times 10^{-14}$
$C_8 = 7.03324 \times 10^{-48}$  $C_{10} = -8.90549 \times 10^{-23}$
$C_{12} = -5.62876 \times 10^{-26}$  $C_{14} = 3.85251 \times 10^{-30}$ Surface 38

$\kappa = 0.000000$
$C_4 = 2.53912 \times 10^{-8}$  $C_6 = 3.91063 \times 10^{-13}$
$C_8 = 7.05067 \times 10^{-18}$  $C_{10} = 2.97494 \times 10^{-22}$
$C_{12} = -1.09989 \times 10^{-26}$  $C_{14} = 3.64199 \times 10^{-31}$ Surface 41

$\kappa = 0.000000$
$C_4 = -1.15678 \times 10^{-8}$  $C_6 = -1.04478 \times 10^{-13}$
$C_8 = -1.72165 \times 10^{-18}$  $C_{10} = 3.51511 \times 10^{-22}$
$C_{12} = -2.28722 \times 10^{-27}$  $C_{14} = 1.43968 \times 10^{-31}$ Surface 52

$\kappa = 0.000000$
$C_4 = -3.26364 \times 10^{-8}$  $C_6 = -5.39112 \times 10^{-13}$
$C_8 = 4.63415 \times 10^{-17}$  $C_{10} = -6.39744 \times 10^{-21}$
$C_{12} = 2.45549 \times 10^{-25}$  $C_{14} = -5.36486 \times 10^{-30}$ (Values For Conditional Expressions)

| | |
|---|---|
| Dw = | 17 mm |
| Nw = | 0.84 |
| Ew = | 22 mm |
| S = | 283.0471 mm |
| R = | 211.5661 mm |
| (1) (Dw · Nw)/Ew = | 0.649 |
| (2) S/\|R\| = | 1.338 |

Figure 8:
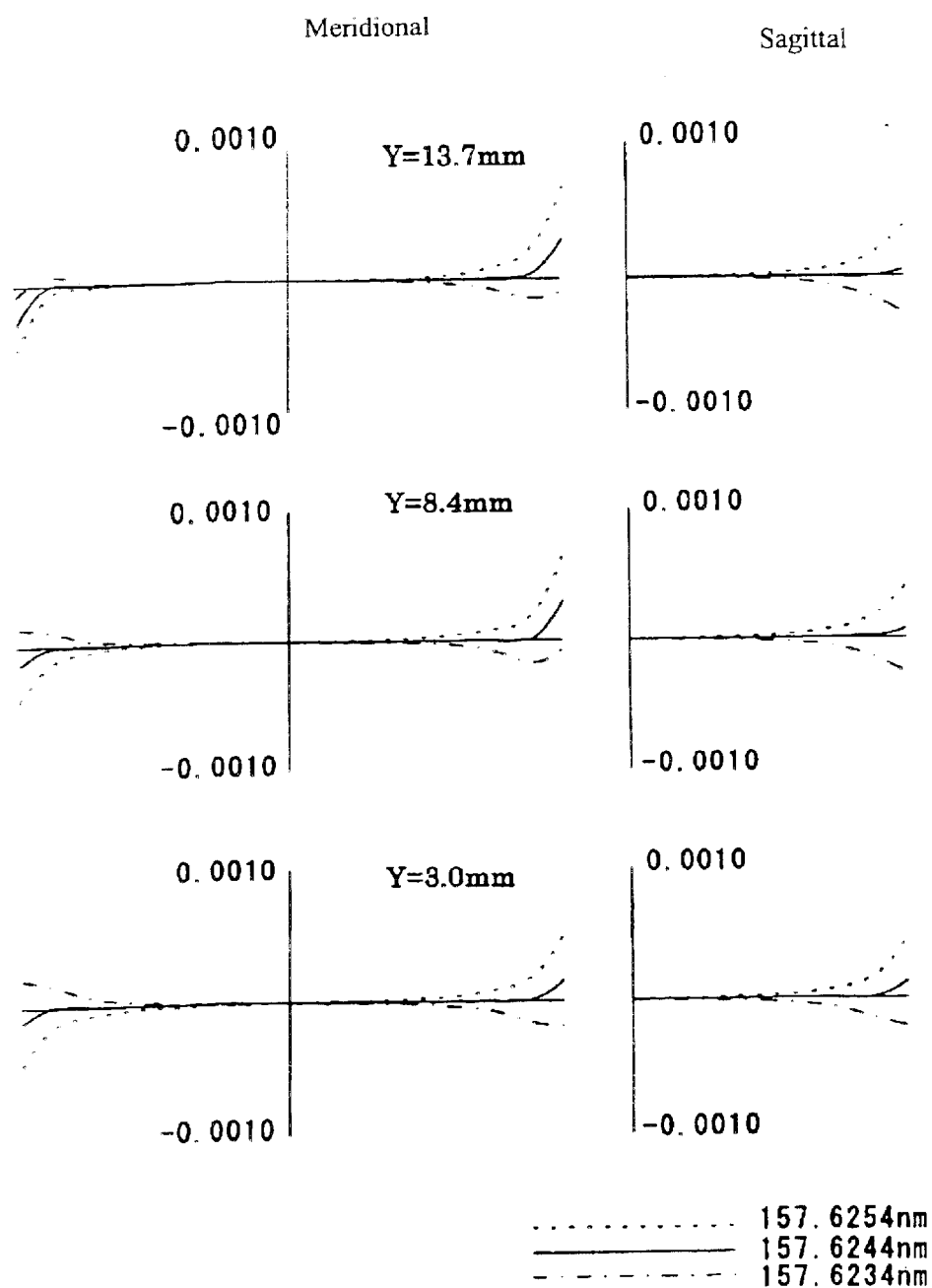
FIG. 8 is a diagram of the lateral distortion in the first example.

FIG. 8 shows the lateral aberrations in the first working example. In the aberration diagram, Y is the image height, the solid line is the center wavelength 157.6244 nm, the dotted line is the wavelength 157.6244 nm+1 pm=157.6254 nm, the dot-dashed line is the wavelength 157.6244 nm−1 pm=157.6234 nm. As is clear from the aberration diagram, the chromatic aberration in the first working example is effectively corrected for an exposure light with a wavelength bandwidth of 157.624 nm±1 pm.

SECOND WORKING EXAMPLE

Figure 9:
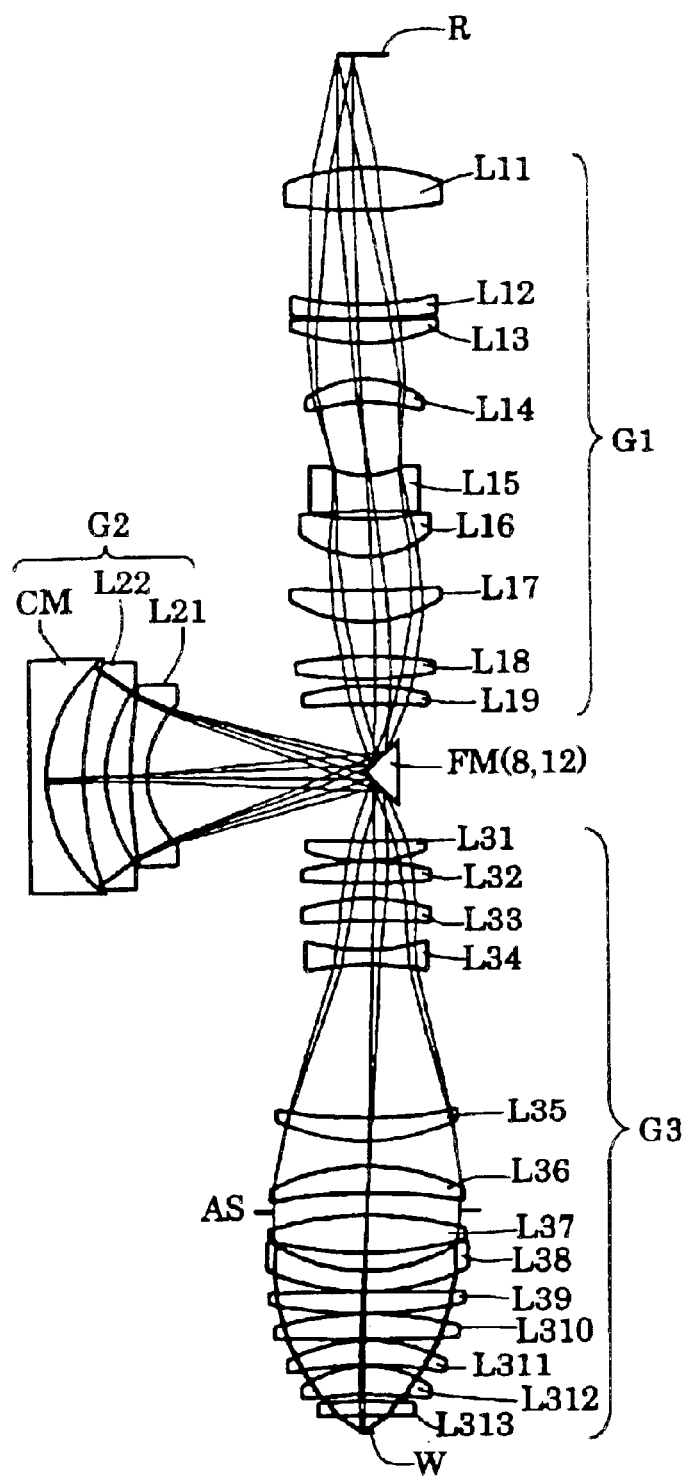
FIG. 9 is a diagram of the lens structure of the projection optical system PL in the second example.

FIG. 9 shows the lens structure of the projection optical system described in the second working example. It should be noted that the second working example adopts the present invention the same as the first embodiment in a projection optical system with various aberrations including chromatic aberrations corrected for an exposure light with a wavelength bandwidth of 157.6244 nm±1 pm.

In the projection optical system in FIG. 9, beginning from the reticle side, the first optical imaging system G1 is comprised of a biconvex lens L11, a negative meniscus lens L12 with the aspherical concave surface facing the reticle side, a positive meniscus lens L13 with the concave lens facing the reticle side, a positive meniscus lens L14 with the concave surface facing the reticle, a biconcave lens L15, a positive meniscus lens L16 with the concave lens facing the reticle side, a positive meniscus L17 with the concave lens facing the reticle side, a biconvex lens L18, and a positive meniscus lens L19 with the aspherical concave surface facing the wafer side.

Also, beginning in order from the reticle side (in other words, the entrance side) along the light progression direction, the second optical imaging system G2 is comprised of a negative meniscus lens L21 with the aspherical concave side facing the reticle side, a negative meniscus L22 with the aspherical concave side facing the reticle, and a concave reflective mirror CM with the concave surface facing the reticle.

Furthermore, beginning in order from the reticle side along the light progression direction, the third optical imaging system G3 is comprised of a positive meniscus lens L31 with the concave surface facing the reticle side, a biconvex lens L32, a positive meniscus lens L33 with the convex surface facing the reticle side, a biconcave lens L34 with the aspherical concave surface facing the reticle side, a positive meniscus lens L35 with the aspherical concave surface facing the reticle side, a positive meniscus lens L36 with the aspherical concave surface facing the wafer side, an aperture stop AS, a biconvex lens L37, a negative meniscus lens L38 with the concave surface facing the reticle side, a planoconvex lens L39 with the plane surface facing the reticle side, a biconvex lens L310, a positive meniscus lens L311 with the aspherical concave side facing the wafer side, a positive meniscus lens L312 with the convex side facing the reticle side, and a planoconvex lens L313 with the plane side facing the wafer side.

The various dimensions of the projection optical system in the second working example are listed in the next table (2).

TABLE 2

(Principle Dimensions)

| | |
|---|---|
| λ = | 157.6244 nm |
| β = | −0.25 |
| NA = | 0.84 |
| B = | 13.7 mm |
| A = | 3 mm |
| LX (Ew) = | 22 mm |
| LY = | 5 mm |

(Dimensions of Optical Members)

| Surface Number | r | d | n |
|---|---|---|---|
| | (reticle surface) | 134.0611 | |
| 1 | 262.9619 | 50.0000 | 1.5593067 (lens L11) |
| 2 | −690.2912 | 114.9165 | |
| 3* | −599.9988 | 18.0000 | 1.5593067 (lens L12) |
| 4 | −750.0000 | 1.0000 | |
| 5 | −3025.0000 | 27.9713 | 1.5593067 (lens L13) |

TABLE 2-continued

| | | | |
|---|---|---|---|
| 6 | −244.8589 | 43.6281 | |
| 7 | 114.5751 | 28.3042 | 1.5593067 (lens L14) |
| 8* | 175.8195 | 92.1920 | |
| 9 | −109.5355 | 45.7658 | 1.5593067 (lens L15) |
| 10 | 997.5337 | 10.1935 | |
| 11 | −331.5471 | 44.1807 | 1.5593067 (lens L16) |
| 12 | −131.7230 | 43.6830 | |
| 13 | −1519.9100 | 38.6864 | 1.5593067 (lens L17) |
| 14 | −166.0874 | 44.0031 | |
| 15 | 508.0358 | 27.8372 | 1.5593067 (lens L18) |
| 16 | −487.9084 | 8.7669 | |
| 17 | 265.5991 | 22.9898 | 1.5593067 (lens L19) |
| 18* | 1561.9630 | 86.0000 | |
| 19 | ∞ | −264.6314 | (First Optical Path Folding Mirror 8) |
| 20 | 127.3620 | −20.0000 | 1.5593067 (lens L21) |
| 21 | 702.6119 | −31.1397 | |
| 22* | 164.9999 | −27.0000 | 1.5593067 (lens L22) |
| 23 | 422.8572 | −43.0899 | |
| 24 | 196.5261 | 43.0899 | (Concave Reflective Mirror CM) |
| 25 | 422.8572 | 27.0000 | 1.5593067 (lens L22) |
| 26* | 164.9999 | 31.1397 | |
| 27 | 702.6119 | 20.0000 | 1.5593067 (lens L21) |
| 28 | 127.3620 | 264.6314 | |
| 29 | ∞ | −85.0000 | (Second Optical Path Folding Mirror 12) |
| 30 | 2164.9673 | −24.7566 | 1.5593067 (lens L31) |
| 31 | 219.1763 | −1.0000 | |
| 32 | −296.9471 | −26.3606 | 1.5593067 (lens L32) |
| 33 | 1129.3092 | −20.0736 | |
| 34 | −243.2548 | −28.2049 | 1.5593067 (lens L33) |
| 35 | −1226.1325 | −37.0789 | |
| 36* | 249.2995 | −18.0000 | 1.5593067 (lens L34) |
| 37 | −367.2759 | −192.0672 | |
| 38* | 800.0000 | −28.4116 | 1.5593067 (lens L35) |
| 39 | 247.6103 | −30.2659 | |
| 40 | −246.9554 | −33.9672 | 1.5593067 (lens L36) |
| 41* | −1000.0000 | −20.9789 | |
| 42 | ∞ | −5.0000 | (Aperture Stop AS) |
| 43 | −420.5483 | −47.2146 | 1.5593067 (lens L37) |
| 44 | 412.3925 | −21.7678 | |
| 45 | 197.9152 | −25.0000 | 1.5593067 (lens L38) |
| 46 | 280.6330 | −1.0000 | |
| 47 | ∞ | −27.1468 | 1.5593067 (lens L39) |
| 48 | 531.5277 | −1.0000 | |
| 49 | −422.7241 | −30.3630 | 1.5593067 (lens L310) |
| 50 | 3025.0000 | −1.0000 | |
| 51 | −191.0370 | −31.1678 | 1.5593067 (lens L311) |
| 52* | −674.8686 | −1.0000 | |
| 53 | −128.0047 | −34.6343 | 1.5593067 (lens L312) |
| 54 | −583.8584 | −7.3608 | |
| 55 | −681.9357 | −18.000 | 1.5593067 (lens L313) |
| 56 | ∞ | −20.0000 | |
| | (wafer surface) | | |

(aspherical surface data)

Surface 3

$\kappa = 0.000000$
$C_4 = -8.56936 \times 10^{-8}$   $C_6 = 2.46201 \times 10^{-12}$
$C_8 = -1.55668 \times 10^{-16}$   $C_{10} = 9.43386 \times 10^{-21}$
$C_{12} = -6.07941 \times 10^{-25}$   $C_{14} = 2.17159 \times 10^{-29}$ Surface 8

$\kappa = 0.000000$
$C_4 = -1.69055 \times 10^{-7}$   $C_6 = 2.05649 \times 10^{-12}$
$C_8 = 2.63740 \times 10^{-15}$   $C_{10} = -1.76419 \times 10^{-19}$
$C_{12} = -5.01834 \times 10^{-24}$   $C_{14} = 9.35851 \times 10^{-28}$ Surface 18

$\kappa = 0.000000$
$C_4 = 1.24311 \times 10^{-8}$   $C_6 = -6.42840 \times 10^{-14}$
$C_8 = 3.52871 \times 10^{-18}$   $C_{10} = -1.74809 \times 10^{-22}$
$C_{12} = 3.51815 \times 10^{-26}$   $C_{14} = -3.53925 \times 10^{-30}$ Surface 22
(Same surface as surface 26)

$\kappa = 0.000000$
$C_4 = -2.43802 \times 10^{-8}$   $C_6 = -8.60903 \times 10^{-13}$
$C_8 = -1.80247 \times 10^{-17}$   $C_{10} = -2.47315 \times 10^{-22}$
$C_{12} = -6.90946 \times 10^{-29}$   $C_{14} = -1.56721 \times 10^{-31}$ Surface 36

$\kappa = 0.000000$
$C_4 = -5.26088 \times 10^{-9}$   $C_6 = 8.00291 \times 10^{-13}$
$C_8 = -2.02514 \times 10^{-16}$   $C_{10} = 1.45524 \times 10^{-20}$
$C_{12} = -5.76378 \times 10^{-25}$   $C_{14} = -1.52735 \times 10^{-31}$ Surface 38

$\kappa = 0.000000$
$C_4 = 3.20217 \times 10^{-8}$   $C_6 = 4.27793 \times 10^{-13}$
$C_8 = -1.75553 \times 10^{-17}$   $C_{10} = 8.55718 \times 10^{-22}$
$C_{12} = -2.67846 \times 10^{-26}$   $C_{14} = 4.75297 \times 10^{-31}$ Surface 41

$\kappa = 0.000000$
$C_4 = -1.46322 \times 10^{-8}$   $C_6 = 6.43322 \times 10^{-14}$
$C_8 = -2.51761 \times 10^{-17}$   $C_{10} = 1.37244 \times 10^{-21}$
$C_{12} = -2.75604 \times 10^{-26}$   $C_{14} = 3.93456 \times 10^{-31}$ Surface 52

$\kappa = 0.000000$
$C_4 = -3.13761 \times 10^{-8}$   $C_6 = -8.78276 \times 10^{-13}$
$C_8 = 9.23919 \times 10^{-17}$   $C_{10} = -1.30689 \times 10^{-20}$
$C_{12} = 7.70494 \times 10^{-25}$   $C_{14} = -2.28846 \times 10^{-29}$ (Values For Conditional Expressions)

| | |
|---|---|
| Dw = | 20 mm |
| Nw = | 0.84 |
| Ew = | 22 mm |
| S = | 286.7831 mm |
| R = | 196.5261 mm |
| (1) (Dw · Nw)/Ew = | 0.764 |
| (2) S/\|R\| = | 1.459 |

Figure 10:
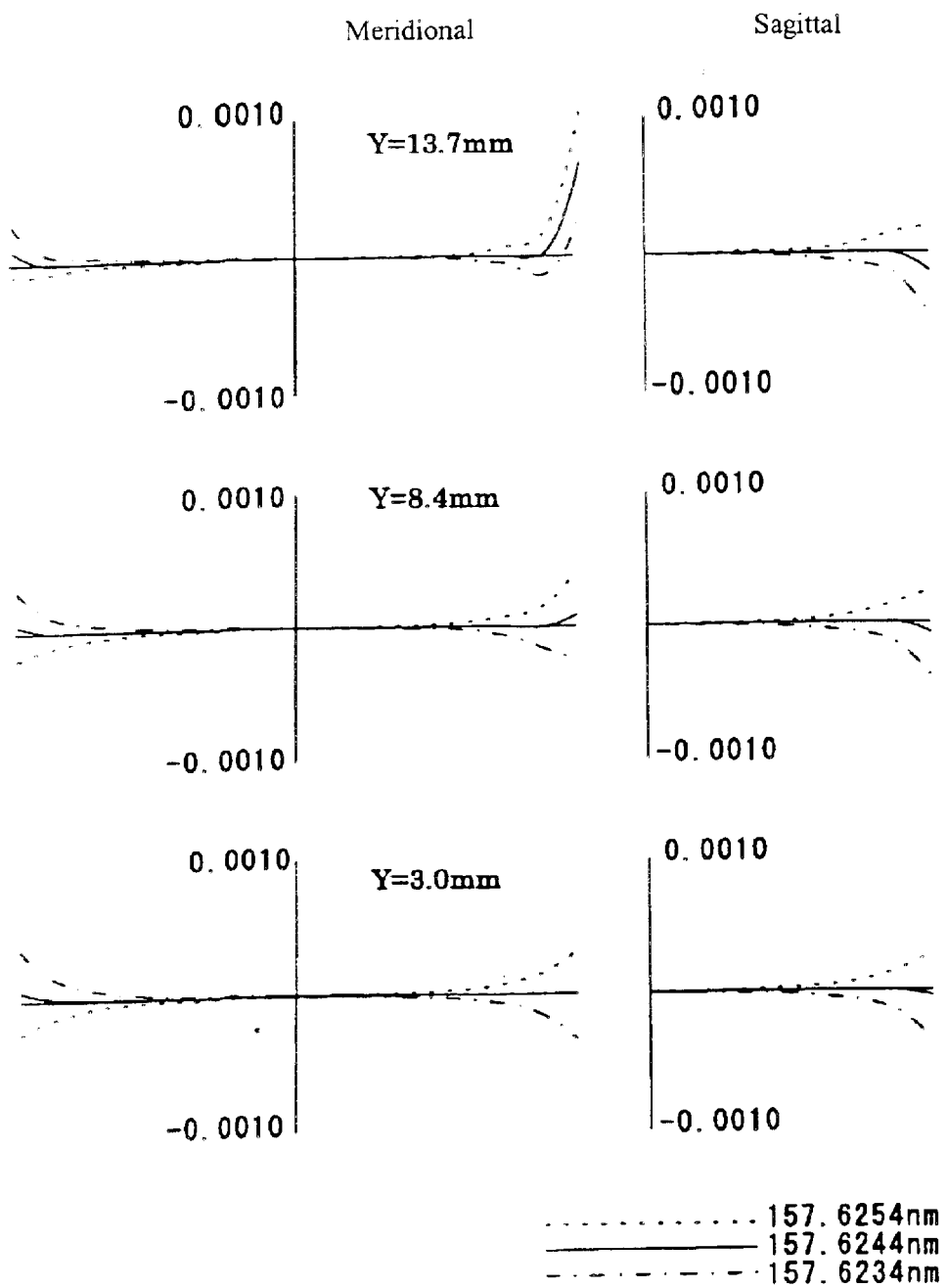
FIG. 10 is a diagram of the lateral distortion in the second example.

FIG. 10 shows the lateral aberrations in the second working example. In the aberration diagram, Y is the image height, the solid line is the center wavelength 157.6244 nm, the dotted line is the wavelength 157.6244 nm+1 pm 157.6254 nm, the dot-dashed line is the wavelength 157.6244 nm−1 pm=157.6234 nm. As is clear from the aberration diagram, the chromatic aberration in the second working example is effectively corrected similar to the first working example for an exposure light with a wavelength bandwidth of 157.624 nm±1 pm.

As described above in each working example, it is possible to effectively avoid contamination of the lenses caused by outgas from the photoresist coated on the wafer W because the conditional expression (1) is satisfied. Also, in each working example the concave reflective mirror CM and the negative lenses (L21, L22) are arranged along the light axis AX2 in the direction orthogonal to the direction of gravity, but because conditional expression (2) is satisfied, distortions of the concave reflective mirror CM caused by gravity are kept low, and assembly adjustment and working are eased.

In a projection optical system according to a third embodiment, a polarization aberration (i.e., a phase difference between light of a first polarization component having a vibration (polarization) direction in a predetermined direction and light of a second polarization component having a vibration (polarization) direction different from the first polarization direction) which is generated by intrinsic birefringence of an isometric (cubic) crystal optical material (e.g., fluorite) constituting the projection optical system is corrected by a thin film arranged on the surface of the optical material.

Figure 13:
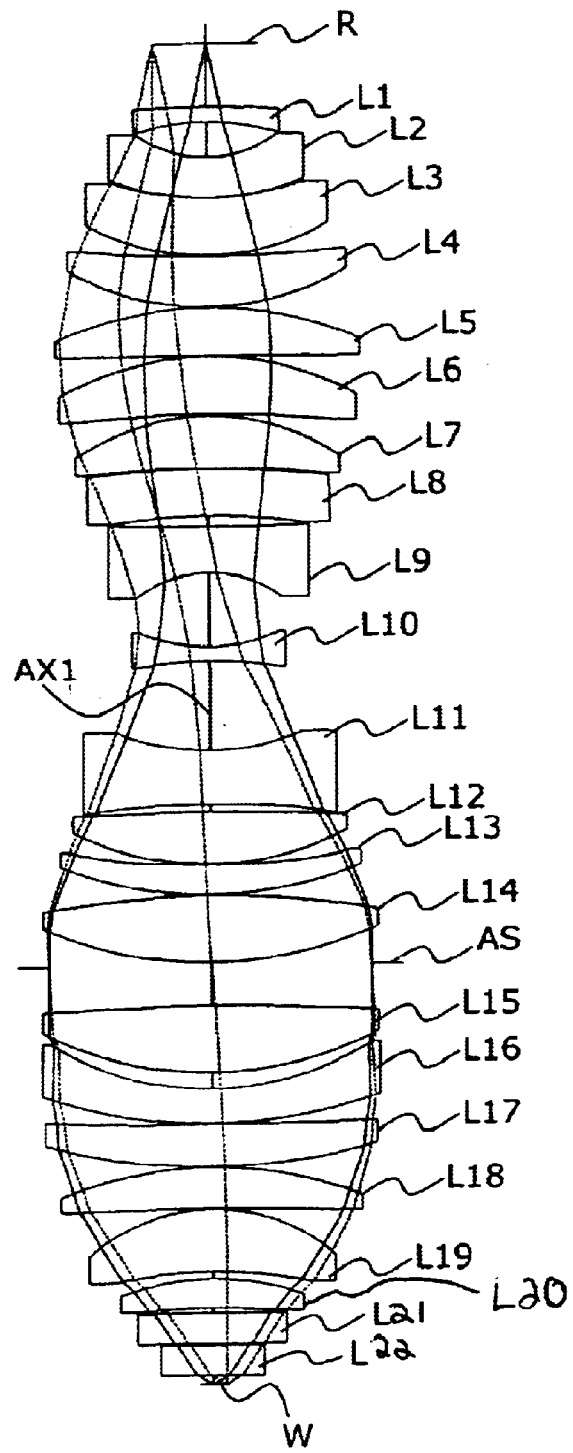
FIG. 13 is a diagram showing a lens structure of a projection optical system PL according to a third embodiment.

In the third embodiment, in order to make an incident state of light incident to the thin film the same as in a real case, a projection optical system shown in FIG. 13 is considered. FIG. 13 is a diagram showing a lens structure of a projection optical system according to the third embodiment. The projection optical system of FIG. 13 is different from the above-mentioned first and second embodiments, and applies this invention to a dioptric type projection optical system in which a plurality of refractive optical members are arranged along a linear optical axis.

From the reticle R side, in order, the projection optical system of FIG. 13 is constituted by a negative meniscus lens L1 having a concave surface facing the wafer W side, a negative meniscus lens L2 having a concave surface facing the reticle R side, two positive meniscus lenses L3, L4 having a concave surface facing the reticle R side, three positive meniscus lenses L5-L7 having a convex surface facing the reticle R side, a negative meniscus lens L8 having a concave surface facing the wafer W side, three biconcave lenses L9-L11, a biconvex lens L12, a positive meniscus lens L13 having a concave surface facing the reticle R side, a biconvex lens L14, an aperture stop AS, a biconvex lens L15, a negative meniscus lens L16 having a concave surface facing the reticle R side, a positive meniscus lens L17 having a concave surface facing the reticle R side, three positive meniscus lenses L18-L20 having a concave surface facing the wafer W side, a planoconcave lens L21 having a concave surface facing the reticle R side, and a parallel flat plate L22.

Figure 14:
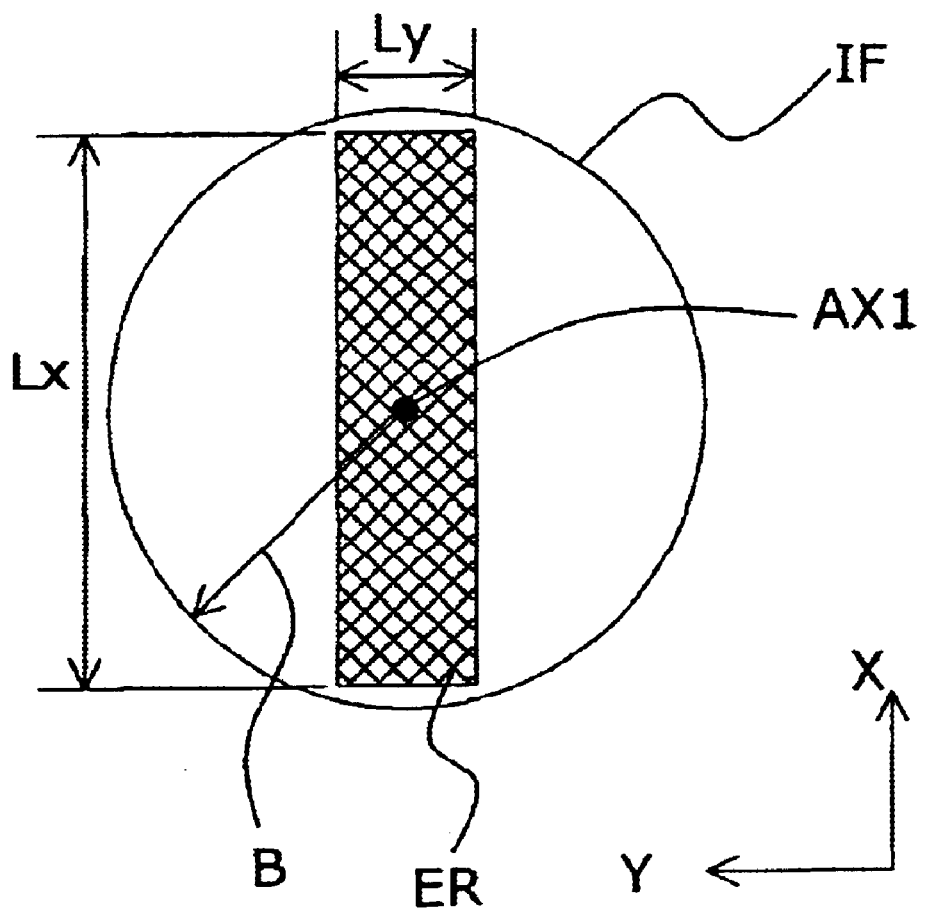
FIG. 14 is a diagram showing a rectangular-shaped exposure region (that is, effective exposure region) formed on a wafer by a projection optical system PL according to the third embodiment.

FIG. 14 is a diagram showing a positional relationship between an optical axis and a rectangular-shaped exposure region (i.e., effective exposure region) formed on the wafer W by a projection optical system according to the third embodiment. As shown in FIG. 14, in the third embodiment, within a round-shaped region (image circle) IF having a radius B about an optical axis AX1, a rectangular-shaped effective exposure region ER having a desired size is set at a position including the optical axis AX1. Here, the length of the effective exposure region ER in the X direction is LX, and the length in the Y direction is LY. Furthermore, an off-axis amount A of the effective exposure region ER in the projection optical system of the third embodiment is 0.

The respective values of the projection optical system according to the third embodiment are shown in the following Table (3). In Table (3), $\lambda$ is the wavelength of exposure light, $\beta$ is the projection magnification, NA is the image side (wafer side) numerical aperture, B is the radius of an image circle IF on the wafer W, LX is a dimension along the X direction (dimension of the long side) of the effective exposure region ER, and LY is a dimension along the Y direction (dimension of the short side) of the effective exposure region ER, respectively.

Furthermore, the surface number refers to the order of the surface from the reticle side along the direction in which a light beam advances from the reticle plane, which is an object plane (first plane), to a wafer surface, which is an image plane (second plane); r is the radius of curvature (the radius of curvature at the vertex in the case of an aspherical surface: mm) of each surface; d is an on-axis distance of each surface, that is, the distance between surfaces (mm); material is the name of the material of the light transmissive member; and coating is the type of an optical thin film arranged on the surface of the light transmissive member. Additionally, in the "radius of curvature" column of each surface, a radius of curvature of a convex surface facing the reticle side is positive, and a radius of curvature of a concave surface is negative. Furthermore, in the "coating" column, ID indicates an ideal optical thin film (that is, a thin film in which transmittance is 100% and no phase difference is given to light passing therethrough), and RE indicates a thin film having a phase difference decreasing function which will be described later.

In the third embodiment, the refractive index n of fluorite with respect to a wavelength $\lambda$ of exposure light is n=1.55930666.

TABLE 3

(Principal Values)

| | |
|---|---|
| $\lambda$ = | 157.62 nm |
| $\beta$ = | −0.25 |
| NA = | 0.85 |
| B = | 11.3 mm |
| A = | 0 |
| LX = | 22 mm |
| LY = | 5 mm |

(Optical Member Values)

| Surface Number | r | d | Material | Coating |
|---|---|---|---|---|
| Object Plane | 0.0000 | 55.0000 | | |
| 1 | 1760.1477 | 13.0000 | fluorite | I D |
| 2* | 154.1222 | 31.5550 | | I D |
| 3 | −100.0051 | 35.1768 | fluorite | I D |
| 4 | −204.4440 | 0.2632 | | I D |
| 5* | −229.9998 | 49.8862 | fluorite | I D |
| 6 | −205.2327 | 1.0000 | | I D |
| 7 | −1022.4100 | 43.9568 | fluorite | I D |
| 8 | −240.0184 | 1.0000 | | I D |
| 9 | 305.3055 | 43.3393 | fluorite | I D |
| 10 | 13811.5160 | 1.0000 | | I D |
| 11 | 260.0366 | 49.9927 | fluorite | I D |
| 12 | 1061.5609 | 1.6965 | | I D |
| 13 | 201.2791 | 44.9989 | fluorite | I D |
| 14* | 1264.2864 | 1.0008 | | I D |
| 15 | 746.2630 | 41.9997 | fluorite | I D |
| 16 | 554.5437 | 9.6189 | | I D |
| 17 | −1904.6110 | 41.9988 | fluorite | I D |
| 18 | 100.8840 | 66.1124 | | I D |
| 19* | −133.6471 | 13.1297 | fluorite | I D |
| 20 | 347.1443 | 81.4331 | | I D |
| 21 | −191.2608 | 47.9972 | fluorite | I D |
| 22* | 1567.7421 | 6.8417 | | I D |
| 23 | 2383.7446 | 45.8049 | fluorite | I D |
| 24 | −254.2886 | 1.0005 | | I D |
| 25* | −826.9931 | 27.1939 | fluorite | I D |
| 26 | −318.6391 | 1.0003 | | I D |
| 27 | 812.6131 | 58.9358 | fluorite | I D |
| 28 | −339.1799 | 3.0000 | | I D |
| 29 | 0.0000 | 35.7374 | | I D |
| 30 | 1993.9339 | 60.0000 | fluorite | I D |
| 31 | −299.7702 | 14.3166 | | I D |
| 32 | −250.3567 | 31.9046 | fluorite | I D |
| 33 | −409.2235 | 1.0000 | | I D |
| 34 | −3543.3950 | 36.4233 | fluorite | I D |
| 35 | −493.5664 | 1.0000 | | I D |
| 36 | 326.4763 | 35.6384 | fluorite | I D |
| 37 | 2606.2523 | 1.0000 | | I D |
| 38 | 150.1197 | 55.0000 | fluorite | I D |
| 39* | 339.1014 | 6.3990 | | I D |
| 40 | 213.3769 | 27.0460 | fluorite | I D |
| 41 | 744.7389 | 4.2700 | | I D |
| 42 | −17499.2300 | 26.5000 | fluorite (C1) | R E |
| 43 | 0.0000 | 1.5001 | | R E |
| 44 | 0.0000 | 26.5000 | fluorite (C2) | R E |
| 45 | 0.0000 | 8.0001 | | R E |

TABLE 3-continued (Aspherical Surface Data)

2$^{nd}$ Surface $\kappa =$ 0.000000
$C_4 =$ −2.27515 × 10$^{-7}$     $C_6 =$ 9.94921 × 10$^{-12}$
$C_8 =$ −4.92700 × 10$^{-16}$    $C_{10} =$ 5.54636 × 10$^{-20}$
$C_{12} =$ −2.11035 × 10$^{-24}$  $C_{14} =$ 3.99019 × 10$^{-28}$ 5$^{th}$ Surface $\kappa =$ 0.000000
$C_4 =$ −8.03956 × 10$^{-10}$    $C_6 =$ 3.19003 × 10$^{-13}$
$C_8 =$ 2.22399 × 10$^{-17}$     $C_{10} =$ 5.84971 × 10$^{-21}$
$C_{12} =$ −3.73576 × 10$^{-25}$  $C_{14} =$ 7.97949 × 10$^{-29}$ 14$^{th}$ Surface $\kappa =$ 0.000000
$C_4 =$ 2.25598 × 10$^{-8}$     $C_6 =$ −2.34895 × 10$^{-13}$
$C_8 =$ 6.24176 × 10$^{-18}$    $C_{10} =$ 3.33460 × 10$^{-22}$
$C_{12} =$ −1.10294 × 10$^{-26}$  $C_{14} =$ 9.31768 × 10$^{-31}$ 19$^{th}$ Surface $\kappa =$ 0.000000
$C_4 =$ 2.76204 × 10$^{-8}$     $C_6 =$ 3.44284 × 10$^{-12}$
$C_8 =$ 2.88450 × 10$^{-16}$    $C_{10} =$ 2.69641 × 10$^{-20}$
$C_{12} =$ 2.97751 × 10$^{-24}$  $C_{14} =$ 1.90637 × 10$^{-28}$ 22$^{nd}$ Surface $\kappa =$ 0.000000
$C_4 =$ 4.32103 × 10$^{-9}$     $C_6 =$ −5.61223 × 10$^{-13}$
$C_8 =$ −2.19658 × 10$^{-17}$   $C_{10} =$ 9.46389 × 10$^{-22}$
$C_{12} =$ 8.20013 × 10$^{-27}$  $C_{14} =$ −8.47779 × 10$^{-31}$ 25$^{th}$ Surface $\kappa =$ 0.000000
$C_4 =$ −1.71489 × 10$^{-8}$    $C_6 =$ 5.86948 × 10$^{-14}$
$C_8 =$ −2.42163 × 10$^{-18}$   $C_{10} =$ 8.02913 × 10$^{-23}$
$C_{12} =$ −4.45790 × 10$^{-27}$  $C_{14} =$ 2.64310 × 10$^{-31}$ 39$^{th}$ Surface $\kappa =$ 0.000000
$C_4 =$ −4.30405 × 10$^{-8}$    $C_6 =$ 2.47690 × 10$^{-12}$
$C_8 =$ −3.60186 × 10$^{-17}$   $C_{10} =$ −5.22555 × 10$^{-21}$
$C_{12} =$ −4.93476 × 10$^{-25}$  $C_{14} =$ −1.51028 × 10$^{-29}$ In the third embodiment, with respect to the two light transmitting members closest to the wafer W side (lenses L21, L22) whose incident angle ranges are large with respect to the light transmitting members, a polarization aberration correction effect by a thin film was considered. In the third embodiment, among the plurality of optical members L1–L22, it is assumed that only the two optical members L21, L22 which are located closest to the wafer W side have intrinsic birefringence. With intrinsic birefringence of the fluorite that forms these optical members, the difference between the value of double refraction in the wavelength of exposure light in the direction of a crystal axis [110] and the value of double refraction in the wavelength of exposure light in the direction of a crystal axis [100] is −3.3 nm/cm. Furthermore, the optical members, L21, L22 are formed so that the crystal axis [111] matches the optical axis AX1, and all the crystal axes different from the crystal axis [111] of the optical members L21, L22 have a positional relationship which is relatively rotated 60° about the optical axis AX1. That is, the fifth process of this invention is applied to the optical members L21, L22.

Next, a comparison is shown between the case of arranging an ideal optical thin film ID on a surface (lens surface) of the optical members L21, L22, and the case of arranging a thin film RE having a phase difference decreasing function. Here, an ideal optical thin film is a theoretical thin film in which transmittance of the thin film RE is 100%, and which has an effect of imparting no phase difference to light of a plurality of polarization components passing through the thin film. Furthermore, the thin film RE having a phase difference decreasing function has a structure shown in the following table (4).

In the following table (4), λ shows a center wavelength of exposure light. Furthermore, the layer number shows the order of the layer from the side of the base material on which the thin film is arranged, D shows the thickness (nm) of each layer, and n shows the refractive index with respect to a center wavelength of each layer.

TABLE 4

λ = 157.62 nm

| Layer Number | D | n |
| --- | --- | --- |
| 11$^{th}$ layer | 37.19 | 1.418 |
| 10$^{th}$ layer | 21.41 | 1.78 |
| 9$^{th}$ layer | 24.88 | 1.418 |
| 8$^{th}$ layer | 15.37 | 1.78 |
| 7$^{th}$ layer | 20.35 | 1.418 |
| 6$^{th}$ layer | 16.64 | 1.78 |
| 5$^{th}$ layer | 24.74 | 1.418 |
| 4$^{th}$ layer | 17.76 | 1.78 |
| 3$^{rd}$ layer | 20.6 | 1.418 |
| 2$^{nd}$ layer | 10.68 | 1.78 |
| 1$^{st}$ layer | 13.85 | 1.418 |
| Substrate | | |

Figure 15:
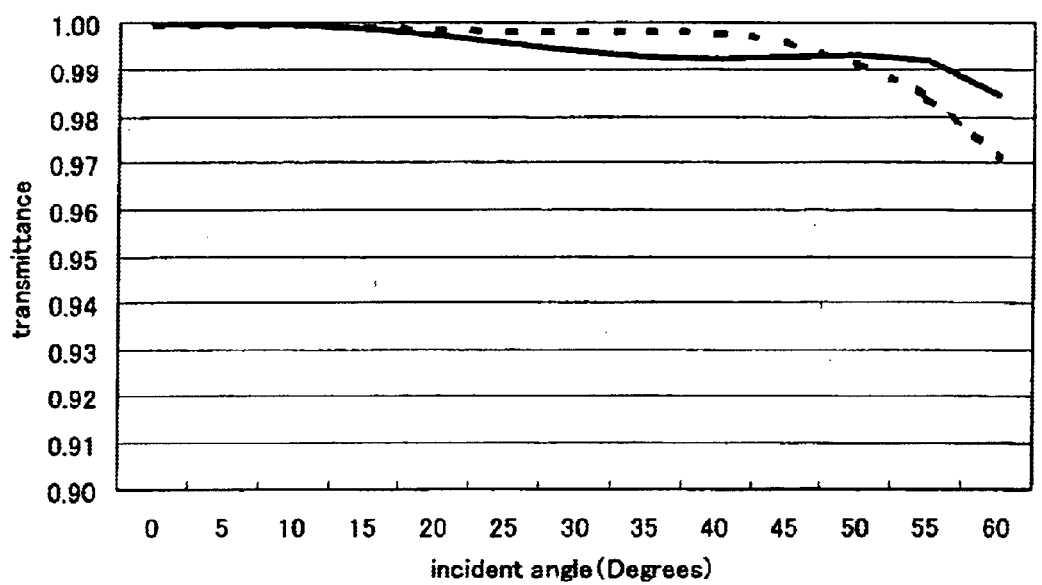
FIG. 15 is a diagram showing incident angle dependence of transmittance of a thin film RE according to the third embodiment.
Figure 16:
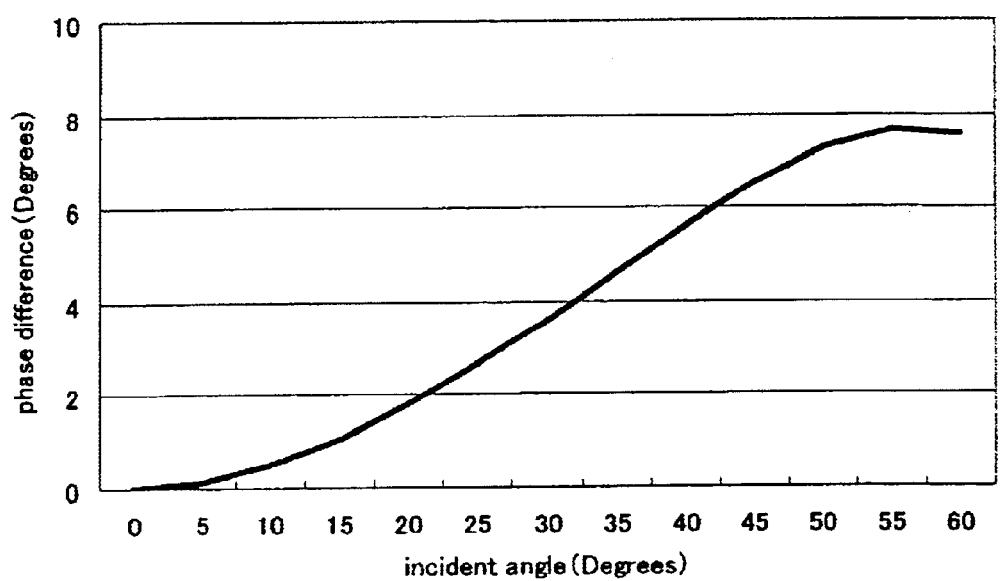
FIG. 16 is a diagram showing incident angle dependence of a phase difference (polarization aberration) of a thin film RE according to the third embodiment.

FIG. 15 shows an incident angle characteristic of transmittance of the thin film RE of Table (4), and FIG. 16 shows an incident angle characteristic of a phase difference of the thin film RE of Table (4). Furthermore, in FIG. 15, transmittance is shown on the vertical axis, and the incident angle (0 in the case of vertical incidence) with respect to the thin film RE is shown on the horizontal axis. Additionally, the broken line of FIG. 15 shows incident angle dependence of transmittance of the thin film RE with respect to a P polarization component (polarization component in which an oscillation direction which is within the incident surface, that is, a polarization component having a polarization plane along a diameter direction of a circle about an axis parallel to the optical axis). The solid line shows incident angle dependence of transmittance of the thin film RE with respect to an S polarization component (a polarization component which is within a plane in which an oscillation direction is perpendicular to an incident surface, that is, a polarization component having a polarization plane along a circumferential direction of a circle about an axis parallel to the optical axis).

Furthermore, in FIG. 16, a phase difference (°) of the P polarization component and the S polarization component after passing through the thin film RE is shown on the vertical axis, and the incident angle (0 in the case of vertical incidence) is shown on the horizontal axis.

As is clear from FIG. 15, the thin film RE ensures transmittance of 98% or more in an incident angle range corresponding to NA=0.85 (that is, an incident angle range up to sin$^{-1}$ (0.85)) and shows a standard which holds up sufficiently to use in practice. Furthermore, as is clear from FIG. 16, the phase difference between the P polarization component and the S polarization component at an incident angle corresponding to NA=0.85 is less than 8°, with the phase of the P polarization component being more advanced than the-phase of the S polarization component. That is, with respect to the light transmitting through the thin film RE, as the incident angle becomes large, the phase of the light of the P polarization component advances more than the phase of the light of the S polarization component.

As described in the third embodiment, when both L21, L22 of the optical transmitting members have an optical axis AX1 matching the crystal axis [111], have substantially the same thickness, and have a positional relationship in which the crystal axes different from the crystal axis [111] are relatively rotated 60° about the optical axis AX1, a pair L21, L22 of the optical members have a fast axis such that the phase of the light of the S polarization component advances more than the phase of the light of the P polarization component as the incident angle becomes larger. Here, the above-mentioned thin film RE has a fast axis perpendicular to a pair L21, L22 of the optical members, so the total phase difference can be decreased by this thin film RE.

Figure 17:
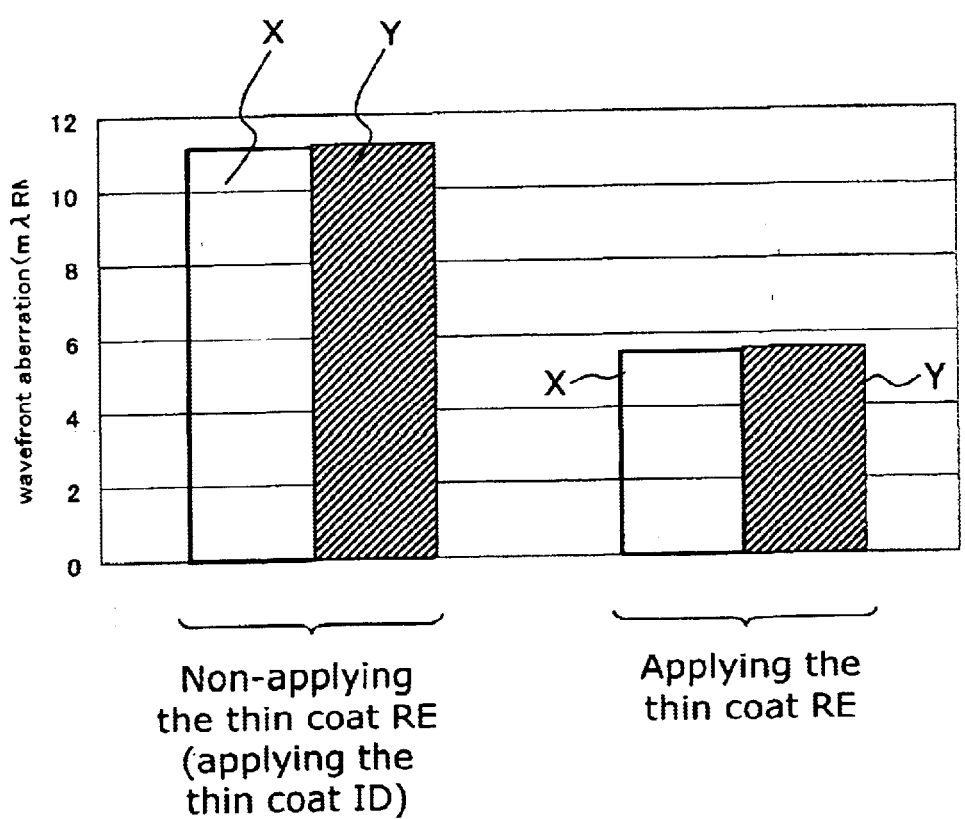
FIG. 17 is a diagram showing a wavefront aberration of a projection optical system according to the third embodiment.

FIG. 17 is a graph showing a comparison between a wavefront aberration when a thin film RE is arranged on a pair L21, L22 of the optical members located closest to the wafer W side and a wavefront aberration when an ideal optical thin film ID is arranged instead of the thin film RE, in a projection optical system having various values shown in table (3). Furthermore, in FIG. 17, X shows a wavefront aberration (mλRMS) of a polarization component having an oscillation direction (polarization plane) in the X direction of FIG. 14, and Y shows a wavefront aberration (mλRMS) of a polarization component having an oscillation direction (polarization plane) in the Y direction of FIG. 14.

With reference to FIG. 17, it is clear that the phase difference correction ability of the thin film RE is sufficiently high. Furthermore, it is also clear that an optical performance capability (imaging performance capability) of a projection optical system can be extremely improved.

It should be noted that fluorite serves as the birefringent optical material in the above-described embodiments; however the invention is not limited to this. Other single axis crystals such as barium fluoride ($BaF_2$), lithium fluoride (LiF), sodium fluoride (NaF), strontium fluoride ($SrF_2$), or the like may be used. In this case, the crystal axis direction of barium fluoride ($BaF_2$) or the like is preferably determined according to the present invention.

In the exposure apparatus in the above-described embodiments, it is possible to fabricate microdevices (semiconductor elements, image pickup devices, liquid crystal display devices, thin film magnetic heads, or the like) by illuminating (an illumination step) a mask (a reticle) via an illumination optical system, and exposing (an exposure step) a pattern for transfer formed on the mask onto a photosensitive substrate using a projection optical system. With reference to the flowchart in FIG. 11, an example of a method, when obtaining a semiconductor device serving as a microdevice, for forming a predetermined circuit pattern on a wafer or the like serving as a photosensitive substrate using the exposure device in the present embodiments will be described.

Figure 11:
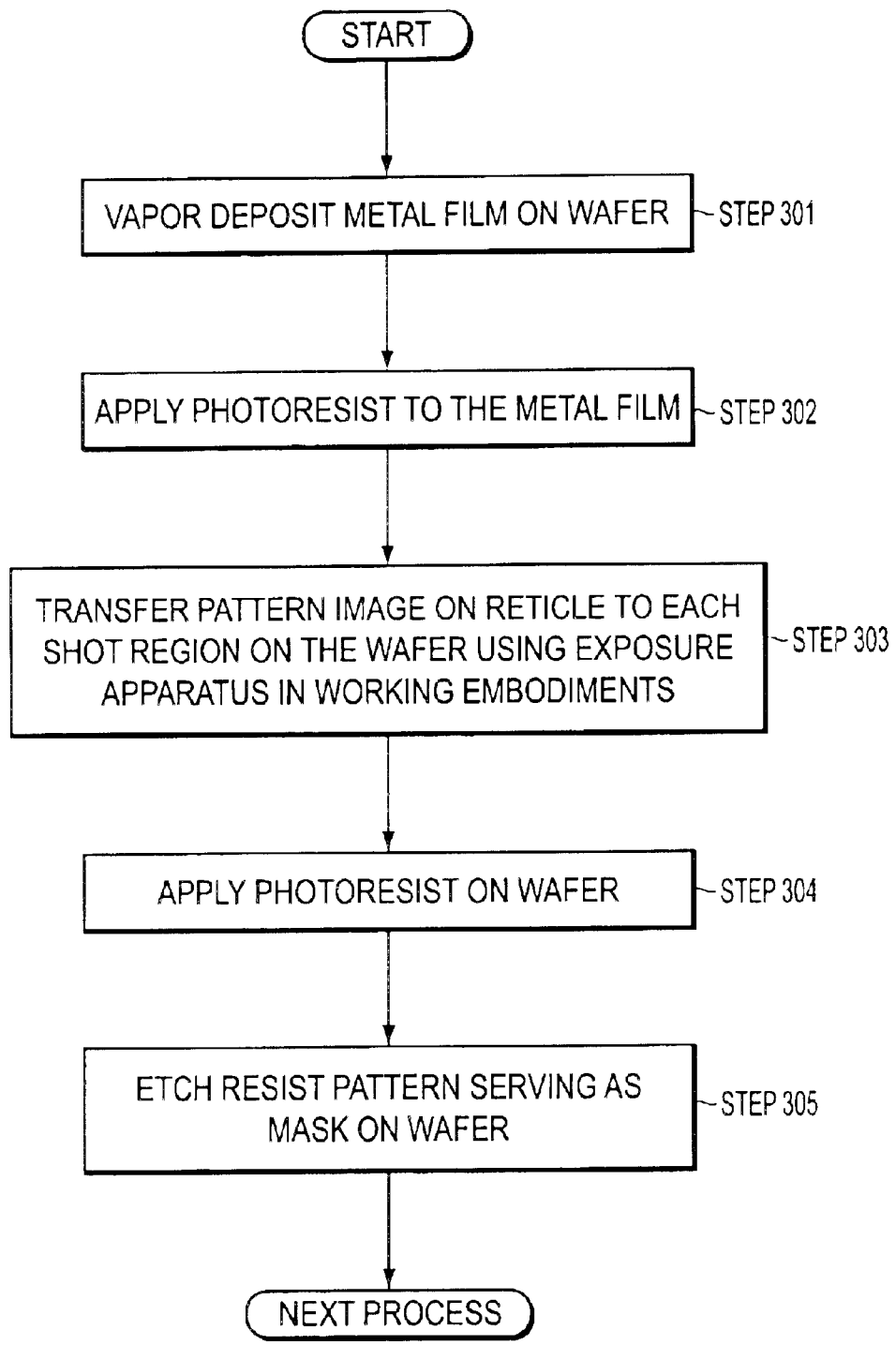
FIG. 11 is a flowchart of a method used to obtain a semiconductor device as one type of microdevice.

First, in step 301 of FIG. 11, a metal film is vapor deposited on one lot of wafers. Next, in step 302, a photoresist is applied to the metal film on the lot of wafers. After that, in step 303, using the exposure apparatus in the present embodiments, the image of a pattern on a mask is successively exposure transferred to each shot region on the lot of wafers via the projection optical system. After that, in step 304, after the photoresist on the lot of wafers is developed, the circuit pattern corresponding to the pattern on the mask is formed on each shot region on each wafer by etching, in step 305, the resist pattern serving as a mask on the lot of wafers.

After that, a semiconductor element or the like is fabricated by performing circuit pattern formation or the like on successive layers. According to the above-described semiconductor device fabrication method, it is possible to obtain, with good throughput, a semiconductor device having a very detailed circuit pattern. It should be noted that, in steps 301 through 305, metal is vapor deposited on the wafer, a resist is coated on the metal thin film, and then the exposure, developing, and etching processes are performed, but before these processes are performed, it is also possible to, after forming a silicon oxide film on the wafer, to coat a resist on the silicon oxide film and then perform the exposure, developing, and etching processes.

Figure 12:
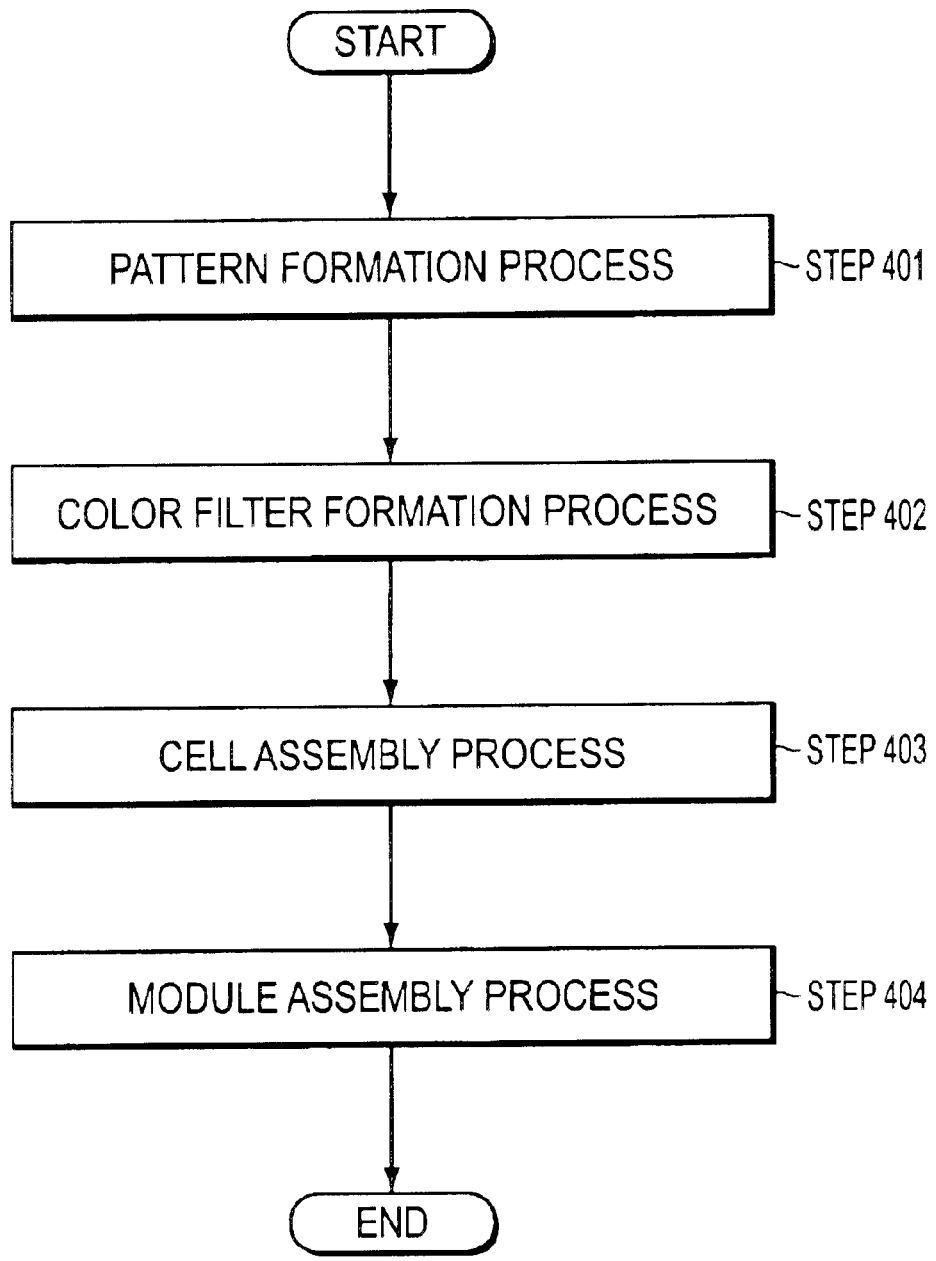
FIG. 12 is a flowchart of a method used to obtain a liquid crystal display device as one type of microdevice.

In the exposure apparatus in the preferred embodiments, it is possible to obtain a liquid crystal display element serving as a microdevice by forming a predetermined pattern (a circuit pattern, an electrode pattern, or the like) on a plate (a glass substrate). Below, with reference to the flowchart in FIG. 12, the method in this process will be described. In FIG. 12, the so-called photolithography step, which transfer exposes a mask pattern to a photosensitive substrate (a glass substrate with a resist applied, or the like) using the exposure apparatus in the embodiments, is performed in the pattern formation step 401. A predetermined pattern containing a plurality of electrodes or the like is formed on the photosensitive substrate in the photolithography step. After that, by passing the exposed pattern through each of the development step, the etching step, the mask removal step or the like, the predetermined pattern is formed on the substrate, and the process moves to the color filter formation step 402.

Next, in the color filter formation step 402, a plurality of sets of three dots corresponding to R (Red), G (Green), and B (Blue) are arranged in a matrix form, or sets of three stripe filters of R, G, B arranged in the direction of a plurality of horizontal scan lines to form a color filter. After the color filter formation step 402, the cell assembly step 403 is executed. In the cell assembly step, a liquid crystal panel (a liquid crystal cell) is assembled using the substrate having a predetermined pattern obtained in the pattern formation step 401, and the color filter obtained in the color filter formation step 402. In the cell assembly step 403, liquid crystal material is injected between the substrate having a predetermined pattern obtained in the pattern formation step 401 and the color filter obtained in the color filter formation step 402, for example, thereby fabricating a liquid crystal panel (a liquid crystal cell).

After that, in the module assembly step 404, each part, an electric circuit for operating the assembled liquid crystal display (the liquid crystal cell), a backlight or the like are attached, completing a liquid crystal display element. According to the above-described liquid crystal display element fabrication method, it is possible to obtain a liquid crystal display element having a very detailed pattern, with good throughput.

It should be noted that in the above-described embodiments, the present invention has been applied to the projection optical system installed in an exposure apparatus; but the invention is not being limited to this. It is also possible to apply the present invention to other projection optical systems. Also, in each of the above-described embodiments an $F_2$ laser light source is used to supply a 157 nm wavelength light; but the invention is not limited to this. It is possible to use, for example, an ArF excimer laser light source to supply a 193 nm wavelength light, an $Ar_2$ laser light source to supply a 126 nm wavelength light, or a $Kr_2$ laser light source to supply a 146 nm wavelength light.

As described above, it is possible with the present invention to realize a projection optical system having excellent optical performance without substantially being affected by birefringence in spite of using optical material with intrinsic birefringence such as fluorite, for example. Also, it is possible to realize a projection optical system capable of effectively avoiding contamination of the lenses caused by outgas from the photoresist. Therefore, by providing the projection optical system in the present invention in an exposure apparatus, it is possible to fabricate excellent microdevices, through high precision projection exposure using a high resolution projection optical system.

While the invention has been described with reference to preferred embodiments thereof, it is to be understood that the invention is not limited to the preferred embodiments or constructions. To the contrary, the invention is intended to cover various modifications and equivalent arrangements conceived by those skilled in lithographic systems. In addition, while the various elements of the preferred embodiments are shown in various combinations and configurations, which are exemplary, other combinations and configurations, including more, less or only a single element, are also within the spirit and scope of the invention.

What is claimed is:

1. A projection optical system capable of forming a reduced image of a first surface at a second surface, comprising:
   at least one radiation transmissive member which is arranged in an optical path between a pupil position of the second surface and the second surface,
   the radiation transmissive member made of a cubic system crystal which has a substantially transmissive characteristic for light with a wavelength of 200 nm or less,
   the radiation transmissive member is formed such that a crystal axis or an optically equivalent crystal axis to the crystal axis nearly aligns with an optical axis of the projection optical system.

2. An exposure apparatus comprising:
   an illumination system to illuminate a mask serving as the first surface; and
   a projection optical system according to claim 1 to form an image of a pattern on the mask onto a photosensitive substrate serving as the second surface.

3. A projection optical system capable of forming a reduced image of a first surface at a second surface, comprising:
   at least one radiation transmissive member of radiation transmissive members exceeding a maximum angle of the transmitting light ray of 20 degrees to the optical axis,
   the at least one radiation transmissive member made from a cubic system crystal which has a substantially transmissive characteristic for light with a wavelength of 200 nm or less,
   the at least one radiation transmissive member is formed such that a crystal axis or an optically equivalent crystal axis to a crystal axis nearly aligns with an optical axis of the projection optical system.

4. An exposure apparatus comprising:
   an illumination system to illuminate a mask serving as the first surface; and
   a projection optical system according to claim 3 to form an image of a pattern on the mask onto a photosensitive substrate serving as the second surface.

5. A projection optical system capable of forming a reduced image of a first surface at a second surface, the projection optical system comprising:

a) a first group of radiation transmissive members formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;
   b) a second group of radiation transmissive members formed such that the crystal axis or an optically equivalent crystal axis to the crystal axis nearly aligns with the optical axis, and is made of a cubic system crystal which has a substantially transmissive characteristic for light with a wavelength of 200 nm or less;
   wherein the first group of radiation transmissive members and the second group of radiation transmissive members have a positional relationship relatively rotated about 45 degrees around the optical axis; and
   wherein both the first group of radiation transmissive members and the second group of radiation transmissive members are arranged in an optical path between a pupil position on the second surface side and the second surface.

6. A projection optical system according to claim 5, wherein at least one of the first group of radiation transmissive members and the second group of radiation transmissive members has at least one aspherical surface.

7. A projection optical system according to claim 6, that satisfies the following condition:

$$|T1-T2|/TA < 0.025 \quad (3)$$

wherein T1 is the total thickness of the first group of radiation transmissive members along the optical axis, T2 is the total thickness of the second group of radiation transmissive members along the optical axis, and TA is the total thickness along the optical axis of all the radiation transmissive members comprising the projection optical system.

8. A projection optical system according to claim 5, that satisfies the following condition:

$$|T1-T2|/TA < 0.025 \quad (3)$$

wherein T1 is the total thickness of the first group of radiation transmissive members along the optical axis, T2 is the total thickness of the second group of radiation transmissive members along the optical axis, and TA is the total thickness along the optical axis of all the radiation transmissive members comprising the projection optical system.

9. A projection optical system according to claim 5, wherein the first group of radiation transmissive members and the second group of radiation transmissive members are formed as one optical member by optical contact or by adhesion.

10. An exposure apparatus comprising:
    an illumination system to illuminate a mask serving as the first surface; and
    a projection optical system according to claim 5 form an image of a pattern on the mask onto a photosensitive substrate serving as the second surface.

11. A projection optical system capable of forming a reduced image of a first surface at a second surface, the projection optical system comprising:
    a first group of radiation transmissive members formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;

a second group of radiation transmissive members formed such that the crystal axis or an optically equivalent crystal axis to the crystal axis nearly aligns with the optical axis, and is made of a cubic system crystal which has a substantially transmissive characteristic for light with a wavelength of 200 nm or less;

wherein the first group of radiation transmissive members and the second group of radiation transmissive members have a positional relationship relatively rotated about 45 degrees around the optical axis; and in both the first group of radiation transmissive members and the second group of radiation transmissive members, the maximum angle of the transmitting light ray to the optical axis is greater than 20 degrees.

12. A projection optical system according to claim 11, wherein at least one of the first group of radiation transmissive members and the second group of radiation transmissive members has at least one aspherical surface.

13. A projection optical system according to claim 12, that satisfies the following condition:

$$|T1-T2|/TA < 0.025 \quad (3)$$

wherein T1 is the total thickness of the first group of radiation transmissive members along the optical axis, T2 is the total thickness of the second group of radiation transmissive members along the optical axis, and TA is the total thickness along the optical axis of all the radiation transmissive members comprising the projection optical system.

14. A projection optical system according to claim 11, wherein the first group of radiation transmissive members and the second group of radiation transmissive members are formed as one optical member by optical contact or by adhesion.

15. A projection optical system according to claim 11, that satisfies the following condition:

$$|T1-T2|/TA < 0.025 \quad (3)$$

wherein T1 is the total thickness of the first group of radiation transmissive members along the optical axis, T2 is the total thickness of the second group of radiation transmissive members along the optical axis, and TA is the total thickness along the optical axis of all the radiation transmissive members comprising the projection optical system.

16. An exposure apparatus comprising:

an illumination system to illuminate a mask serving as the first surface; and a projection optical system according to claim 11 to form an image of a pattern on the mask onto a photosensitive substrate serving as the second surface.

17. A projection optical system which is capable of forming a reduced image of a first surface at a second surface, the projection optical system comprising:

a plurality of lenses, a concave reflective mirror, and a negative lens arranged in proximity to the concave reflective mirror, wherein the negative lens is made of a cubic system crystal which has a substantially transmissive characteristic for light with a wavelength of 200 nm or less, and is formed such that a crystal axis or an optically equivalent crystal axis to the crystal axis nearly aligns with an optical axis of the projection optical system.

18. An exposure apparatus comprising:

an illumination system to illuminate a mask serving as the first surface; and a projection optical system according to claim 17 to form an image of a pattern on the mask onto a photosensitive substrate serving as the second surface.

19. A projection optical system which is capable of forming a reduced image of a first surface at a second surface, the projection optical system comprising:

a plurality of lenses, a concave reflective mirror, a first negative lens arranged in proximity to the concave reflective mirror, a second negative lens arranged in proximity to the concave reflective mirror, wherein:

a) the first negative lens is formed such that a crystal axis or an optically equivalent crystal axis to the crystal axis nearly aligns with an optical axis of the projection optical system, and is made of a cubic system crystal which has a substantially transmissive characteristicfor light with a wavelength of 200 nm or less;

b) the second negative lens is formed such that the crystal axis or an optically equivalent crystal axis to the crystal axis nearly aligns with the optical axis, and is made of a cubic system crystal which has a substantially transmissive characteristic for light with a wavelength of 200 nm or less; and c) the first negative lens and the second negative lens have a positional relationship relatively rotated about 45 degrees around the optical axis.

20. An exposure apparatus comprising:

an illumination system to illuminate a mask serving as the first surface; and a projection optical system according to claim 19 to form an image of a pattern on the mask onto a photosensitive substrate serving as the second surface.

21. A projection optical system capable of forming a reduced image of a first surface at a second surface, the projection optical system comprising:

at least one radiation transmissive member which is arranged in an optical path between a pupil position of the second surface and the second surface, the at least one radiation transmissive member is made of a cubic system crystal which has a substantially transmissive characteristic for light with a wavelength of 200 nm or less, the at least one radiation transmissive member is formed such that a crystal axis or an optically equivalent crystal axis to the crystal axis nearly aligns with an optical axis of the projection optical system.

22. An exposure apparatus comprising:

an illumination system to illuminate a mask serving as the first surface; and a projection optical system according to claim 21 to form an image of a pattern on the mask onto a photosensitive substrate serving as the second surface.

23. A projection optical system capable of forming a reduced image of a first surface at a second surface, the projection optical system comprising:

at least one radiation transmissive member of radiation transmissive members exceeding a maximum angle of the transmitting light ray of 20 degrees to an optical axis of the projection optical system, the at least one radiation transmissive member is made of a cubic system crystal which has substantially transmissive characteristics for light with a wavelength of 200 nm or less, the at least one radiation transmissive member is formed such that a crystal axis or an optically equivalent crystal axis to a crystal axis nearly aligns with the optical axis.

24. An exposure apparatus comprising:
an illumination system to illuminate a mask serving as the first surface; and
a projection optical system according to claim 23 to form an image of a pattern on the mask onto a photosensitive substrate serving as the second surface.

25. A projection optical system capable of forming a reduced image of a first surface at a second surface, the projection optical system comprising:
a) a first group of radiation transmissive members formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;
b) a second group of radiation transmissive members formed such that the crystal axis or an optically equivalent crystal axis to the crystal axis nearly aligns with the optical axis, and is made of a cubic system crystal which has a substantially transmissive characteristic for light with a wavelength of 200 nm or less;
wherein the first group of radiation transmissive members and the second group of radiation transmissive members have a positional relationship relatively rotated about 90 degrees around the optical axis; and
both the first group of radiation transmissive members and the second group of radiation transmissive members are arranged in an optical path between a pupil position on the second surface side and the second surface.

26. A projection optical system according to claim 25, wherein at least one of the first group of radiation transmissive members and the second group of radiation transmissive members has at least one aspherical surface.

27. A projection optical system according to claim 26, wherein the projection optical system satisfies the following condition:

$$|T1-T2|/TA<0.025 \quad (3)$$

wherein T3 is the total thickness of the first group of radiation transmissive members along the optical axis, T4 is the total thickness of the second group of radiation transmissive members along the optical axis, and TA is the total thickness along the optical axis of all the radiation transmissive members comprising the projection optical system.

28. A projection optical system according to claim 25, wherein the projection optical system satisfies the following condition:

$$|T1-T2|/TA<0.025 \quad (3)$$

wherein T3 is the total thickness of the first group of radiation transmissive members along the optical axis, T4 is the total thickness of the second group of radiation transmissive members along the optical axis, and TA is the total thickness along the optical axis of all the radiation transmissive members comprising the projection optical system.

29. A projection optical system according to claim 25, wherein the first group of radiation transmissive members and the second group of radiation transmissive members are formed as one optical member by optical contact or by adhesion.

30. An exposure apparatus comprising:
an illumination system to illuminate a mask serving as the first surface; and
a projection optical system according to claim 25 to form an image of a pattern on the mask onto a photosensitive substrate serving as the second surface.

31. A projection optical system capable of forming a reduced image of a first surface at a second surface, the projection optical system comprising:
a first group of radiation transmissive members formed such that a crystal axis or an optically equivalent crystal axis to the crystal axis nearly aligns with an optical axis of the projection optical system and is made of a cubic system crystal which has a substantially transmissive characteristic for light with a wavelength of 200 nm or less;
a second group of radiation transmissive members formed such that a crystal axis or an optically equivalent crystal axis to the crystal axis nearly aligns with the optical axis, and is made of a cubic system crystal which has a substantially transmissive characteristic for light with a wavelength of 200 nm or less;
wherein the first group of radiation transmissive members and the second group of radiation transmissive members have a positional relationship relatively rotated about 90 degrees around the optical axis; and
in both the first group of radiation transmissive members and the second group of radiation transmissive members, the maximum angle of the transmitting light ray to the optical axis is greater than 20 degrees.

32. A projection optical system according to claim 31, wherein at least one of the first group of radiation transmissive members and the second group of radiation transmissive members has at least one aspherical surface.

33. A projection optical system according to claim 32, wherein the projection optical system satisfies the following condition:

$$|T3-T4|/TA<0.025 \quad (4)$$

wherein T3 is the total thickness of the first group of radiation transmissive members along the optical axis, T4 is the total thickness of the second group of radiation transmissive members along the optical axis, and TA is the total thickness along the optical axis of all the radiation transmissive members comprising the projection optical system.

34. A projection optical system according to claim 31, wherein the first group of radiation transmissive members and the second group of radiation transmissive members are formed as one optical member by optical contact or by adhesion.

35. A projection optical system according to claim 31, wherein the projection optical system satisfies the following condition:

$$|T3-T4|/TA<0.025 \quad (4)$$

wherein T3 is the total thickness of the first group of radiation transmissive members along the optical axis, T4 is the total thickness of the second group of radiation transmissive members along the optical axis, and TA is the total thickness along the optical axis of all the radiation transmissive members comprising the projection optical system.

36. An exposure apparatus comprising:
an illumination system to illuminate a mask serving as the first surface; and
a projection optical system according to claim 31 to form an image of a pattern on the mask onto a photosensitive substrate serving as the second surface.

37. A projection optical system which is capable of forming a reduced image of a first surface at a second surface, the projection optical system comprising:
- a plurality of lenses,
- a concave reflective mirrors, and
- a negative lens arranged in proximity to the concave reflective mirror,
- wherein the negative lens is made of a cubic system crystal which has a substantially transmissive characteristic for light with a wavelength of 200 nm or less, and is formed such that a crystal axis or an optically equivalent crystal axis to the crystal axis nearly aligns with an optical axis of the projection optical system.

38. An exposure apparatus comprising:
- an illumination system to illuminate a mask serving as the first surface; and
- a projection optical system according to claim 37 to form an image of a pattern on the mask onto a photosensitive substrate serving as the second surface.

39. A projection optical system which is capable of forming a reduced image of a first surface at a second surface, the projection optical system comprising:
- a plurality of lenses,
- a concave reflective mirror,
- a first negative lens arranged in proximity to the concave reflective mirror, and
- a second negative lens arranged in proximity to the concave reflective mirror,
- wherein:
  - a) the first negative lens is formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;
  - b) the second negative lens is formed such that the crystal axis or an optically equivalent crystal axis to the crystal axis nearly aligns with the optical axis, and is made of a cubic system crystal which has a substantially transmissive characteristic for light with a wavelength of 200 nm or less; and
  - c) the first negative lens and the second negative lens have a positional relationship relatively rotated about 90 degrees around the optical axis.

40. An exposure apparatus comprising:
- an illumination system to illuminate a mask serving as the first surface; and
- a projection optical system according to claim 39 to form an image of a pattern on the mask onto a photosensitive substrate serving as the second surface.

41. A projection optical system capable of forming a reduced image of a first surface at a second surface, the projection optical system comprising:
- a) a first group of radiation transmissive members formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;
- b) a second group of radiation transmissive members formed such that the crystal axis or an optically equivalent crystal axis to the crystal axis nearly aligns with the optical axis, and is made of a cubic system crystal which has a substantially transmissive characteristics for light with a wavelength of 200 nm or less;
- wherein the first group of radiation transmissive members and the second group of radiation transmissive members have a positional relationship relatively rotated about 60 degrees around the optical axis; and
- both the first group of radiation transmissive members and the second group of radiation transmissive members are arranged in an optical path between a pupil position on the second surface side and the second surface.

42. A projection optical system according to claim 41, wherein at least one of the first group of radiation transmissive members and the second group of radiation transmissive members has at least one aspherical surface.

43. A projection optical system according to claim 42, wherein the projection optical system satisfies the following condition:

$$|T5-T6|/TA<0.025 \tag{5}$$

wherein T5 is the total thickness of the first group of radiation transmissive members along the optical axis, T6 is the total thickness of the second group of radiation transmissive members along the optical axis, and TA is the total thickness along the optical axis of all the radiation transmissive members comprising the projection optical system.

44. A projection optical system according to claim 41, wherein the projection optical system satisfies the following condition:

$$|T5-T6|/TA<0.025 \tag{5}$$

wherein T5 is the total thickness of the first group of radiation transmissive members along the optical axis, T6 is the total thickness of the second group of radiation transmissive members along the optical axis, and TA is the total thickness along the optical axis of all the radiation transmissive members comprising the projection optical system.

45. A projection optical system according to claim 41, wherein the first group of radiation transmissive members and the second group of radiation transmissive members are formed as one optical member by optical contact or by adhesion.

46. An exposure apparatus comprising:
- an illumination system to illuminate a mask serving as the first surface; and
- a projection optical system according to claim 41 to form an image of a pattern on the mask onto a photosensitive substrate serving as the second surface.

47. A projection optical system capable of forming a reduced image of a first surface at a second surface, the projection optical system comprising:
- a first group of radiation transmissive members formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;
- a second group of radiation transmissive members formed such that the crystal axis or an optically equivalent crystal axis to the crystal axis nearly aligns with the optical axis, and is made of a cubic system crystal which has a substantially transmissive characteristic for light with a wavelength of 200 nm or less;
- wherein the first group of radiation transmissive members and the second group of radiation transmissive members have a positional relationship relatively rotated about 60 degrees around the optical axis; and in both the first group of radiation transmissive members and the second group of radiation transmissive members, the maximum angle of the transmitting light ray to the optical axis is greater than 20 degrees.

48. A projection optical system according to claim 47, wherein at least one of the first group of radiation transmissive members and the second group of radiation transmissive members has at least one aspherical surface.

49. A projection optical system according to claim 48, wherein the projection optical system satisfies the following condition:

$$|T5-T6|/TA < 0.025 \quad (5)$$

wherein T5 is the total thickness of the first group of radiation transmissive members along the optical axis, T6 is the total thickness of the second group of radiation transmissive members along the optical axis, and TA is the total thickness along the optical axis of all the radiation transmissive members comprising the projection optical system.

50. A projection optical system according to claim 47, wherein the first group of radiation transmissive members and the second group of radiation transmissive members are formed as one optical member by optical contact or by adhesion.

51. A projection optical system according to claim 47, wherein the projection optical system satisfies the following condition:

$$|T5-T6|/TA < 0.025 \quad (5)$$

wherein T5 is the total thickness of the first group of radiation transmissive members along the optical axis, T6 is the total thickness of the second group of radiation transmissive members along the optical axis, and TA is the total thickness along the optical axis of all the radiation transmissive members comprising the projection optical system.

52. An exposure apparatus comprising:

an illumination system to illuminate a mask serving as the first surface; and a projection optical system according to claim 47 to form an image of a pattern on the mask onto a photosensitive substrate serving as the second surface.

53. A projection optical system which is capable of forming a reduced image of a first surface at a second surface, the projection optical system comprising:

a plurality of lenses, a concave reflective mirror, a first negative lens arranged in proximity to the concave reflective mirror, and a second negative lens arranged in proximity to the concave reflective mirror, wherein:

a) the first negative lens is formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;

b) the second negative lens is formed such that a crystal axis or an optically equivalent crystal axis to the crystal axis nearly aligns with the optical axis, and is made of a cubic system crystal which has a substantially transmissive characteristic for light with a wavelenght of 200 nm or less; and c) the first negative lens and the second negative lens have a positional relationship relatively rotated about 60 degrees around the optical axis.

54. An exposure apparatus comprising:

an illumination system to illuminate a mask serving as the first surface; and a projection optical system according to claim 53 to form an image of a pattern on the mask onto a photosensitive substrate serving as the second surface.

55. A projection optical system capable of forming a reduced image of a first surface at a second surface, the projection optical system comprising:

a) a radiation transmissive member formed of a crystal having substantially transmissive characteristics for light with a wavelength of 200 nm or less;

b) a crystal coat formed of the crystal formed on a surface of the radiation transmissive member; and c) the crystal direction of the radiation transmissive member and the crystal direction of the crystal coat are different.

56. A projection optical system according to claim 55, wherein the crystal direction along the optical axis of the radiation transmissive member and the crystal direction along the optical axis of the crystal coat are different.

57. A projection optical system according to claim 55, wherein:

a) the crystal direction along the optical axis of the radiation transmissive member and the crystal direction along the optical axis of the crystal coat nearly align; and b) the radiation transmissive member and the crystal coat have a positional relationship relatively rotated to a predetermined angle with the optical axis serving as a center.

58. An exposure apparatus comprising:

an illumination system to illuminate a mask serving as the first surface; and a projection optical system according to claim 55 to form an image of a pattern on the mask onto a photosensitive substrate serving as the second surface.

59. A projection optical system capable of forming a reduced image of a first surface at a second surface, the projection optical system comprising:

a) a first group of radiation transmissive members formed such that a crystal axis or an optically equivalent crystal axis to the crystal axis nearly aligns with an optical axis of the projection optical system, and is made of a cubic system crystal which has a substantially transmissive characteristic for light with a wavelength of 200 nm or less;

b) a second group of radiation transmissive members formed such that a crystal axis or an optically equivalent crystal axis to the crystal axis nearly aligns with the optical axis, and is made of a cubic system crystal which has a substantially transmissive characteristic for light with a wavelength of 200 nm or less; and c) a third group of radiation transmissive members formed such that a crystal axis or an optically equivalent crystal axis to the crystal axis nearly aligns with the optical axis, and is made of a cubic system crystal which has a substantially transmissive characteristic for light with a wavelength of 200 nm or less.

60. An exposure apparatus comprising:

an illumination system to illuminate a mask serving as the first surface; and a projection optical system according to claim 59 to form an image of a pattern on the mask onto a photosensitive substrate serving as the second surface.

61. A projection optical system capable of forming a reduced image of a first surface onto a second surface, comprising:

at least one radiation transmissive member formed of a crystal having substantially transmissive characteristics for light with a wavelength below 200 nm; and a coat on a surface of the radiation transmissive member;

wherein the coat reduces a phase difference between a first polarized light and a second polarized light which is different from the first polarized light when the first polarized light and the second polarized light pass through the projection optical system.

62. A projection optical system according to claim 61, wherein the coat reduces the phase difference between the first polarized light and the second polarized light when the first polarized light and the second polarized light pass through the radiation transmissive member.

63. A projection optical system according to claim 62, comprising at least two of the radiation transmissive members formed of the crystal having substantially transmissive characteristics for light with a wavelength below 200 nm;

wherein crystal axes of the at least two radiation transmissive members are set to reduce the phase difference between the first polarized light and the second polarized light which pass through the projection optical system; and wherein the coat further reduces the phase difference, reduced by the at least two radiation transmissive members, between the first polarized light and the second polarized light which pass through the projection optical system.

64. A projection optical system according to claim 63, wherein the coat comprises an anti-reflecting coat.

65. A projection optical system according to claim 64, wherein a crystal coat is formed of the crystal on a surface of the radiation transmissive member, and a crystal direction of the radiation transmissive member and a crystal direction of the crystal coat are substantially different.

66. A projection optical system according to claim 62, wherein a crystal coat is formed of the crystal on a surface of the radiation transmissive member, and a crystal direction of the radiation transmissive member and a crystal direction of the crystal coat are substantially different.

67. A projection optical system according to claim 61, comprising at least two of the radiation transmissive members formed of the crystal having substantially transmissive characteristics for light with a wavelength below 200 nm;

wherein crystal axes of the at least two radiation transmissive members are set to reduce the phase difference between the first polarized light and the second polarized light which pass through the projection optical system; and wherein the coat further reduces the phase difference, reduced by the at least two radiation transmissive members, between the first polarized light and the second polarized light which pass through the projection optical system.

68. A projection optical system according to claim 61, wherein the coat comprises an anti-reflecting coat.

69. A projection optical system according to claim 61, wherein a crystal coat is formed of the crystal on a surface of the radiation transmissive member, and a crystal direction of the radiation transmissive member and a crystal direction of the crystal coat are substantially different.

70. An exposure apparatus comprising:

an illumination system to illuminate a mask serving as the first surface; and a projection optical system according to claim 61 to form an image of a pattern on the mask onto a photosensitive substrate serving as the second surface.

* * * * *